(12) United States Patent
Yokoyama

(10) Patent No.: US 9,099,614 B2
(45) Date of Patent: Aug. 4, 2015

(54) SEMICONDUCTOR LIGHT EMITTING ELEMENT

(71) Applicant: TOYODA GOSEI CO., LTD., Kiyosu-shi, Aichi-ken (JP)

(72) Inventor: Eisuke Yokoyama, Ichihara (JP)

(73) Assignee: TOYODA GOSEI CO., LTD., Aichi (JP)

( * ) Notice: Subject to any disclaimer, the term of this patent is extended or adjusted under 35 U.S.C. 154(b) by 102 days.

(21) Appl. No.: 13/965,761

(22) Filed: Aug. 13, 2013

(65) Prior Publication Data

US 2014/0061711 A1    Mar. 6, 2014

(30) Foreign Application Priority Data

Aug. 28, 2012   (JP) .................................. 2012-187268

(51) Int. Cl.

| H01L 31/102 | (2006.01) |
| H01L 33/42 | (2010.01) |
| H01L 33/38 | (2010.01) |
| H01L 33/20 | (2010.01) |

(52) U.S. Cl.
CPC ............... *H01L 33/42* (2013.01); *H01L 33/38* (2013.01); *H01L 33/20* (2013.01)

(58) Field of Classification Search
CPC ...................................................... H01L 33/42
USPC ................................................... 257/184, 189
See application file for complete search history.

(56) References Cited

U.S. PATENT DOCUMENTS

| 2008/0006842 A1* | 1/2008 | Seong et al. .................... 257/99 |
| 2012/0012874 A1* | 1/2012 | Morioka et al. ................ 257/98 |

FOREIGN PATENT DOCUMENTS

JP    2005-123501 A    5/2005

* cited by examiner

*Primary Examiner* — Long K Tran
(74) *Attorney, Agent, or Firm* — Sughrue Mion, PLLC

(57) ABSTRACT

A semiconductor light emitting element suppressing non-uniformity in light emission on a light emitting surface is provided. An n-type semiconductor layer, a light emitting layer and a p-type semiconductor layer are laminated in order, and a translucent electrode film is laminated on the p-type semiconductor layer and a p-electrode is provided on the translucent electrode film. On the other hand, an n-electrode is provided on a semiconductor layer exposure surface that exposes the n-type semiconductor layer. The p-electrode includes a connecting portion having a circular planar shape and an extending portion that extends like a long and slender strip from the connecting portion to encircle and face the n-electrode. Holes in the translucent electrode film are provided such that the density thereof is decreased along with a move from the n-electrode side toward the p-electrode side.

4 Claims, 12 Drawing Sheets

SEMICONDUCTOR LIGHT EMITTING ELEMENT

CROSS REFERENCE TO RELATED APPLICATIONS

This application is based on and claims priority under 35 USC §119 from Japanese Patent Application No. 2012-187268 filed Aug. 28, 2012, incorporated herein by reference in its entirety.

BACKGROUND

1. Technical Field

The present invention relates to a semiconductor light emitting element.

2. Related Art

In recent years, significant advances have been seen in the area of semiconductor light emitting elements. In particular, semiconductor light emitting elements (light emitting diodes) using semiconductor materials of GaInN, AlGaInP and GaAlAs with high light emission efficiency become commercially practical. Moreover, a group III nitride semiconductor such as gallium nitride (GaN) receives attention.

In a semiconductor light emitting element using such a group III nitride semiconductor, a laminated semiconductor layer having a light emitting diode (LED) structure configured with an n-type semiconductor layer, a light emitting layer and a p-type semiconductor layer is formed on a substrate and an electrode having optical permeability (a translucent electrode) is formed on the p-type semiconductor layer at an uppermost portion to extract emitted light through the translucent electrode.

In Japanese Patent Application Laid-Open Publication No. 2005-123501, there is described a GaN-based semiconductor light emitting element including an n-type GaN-based semiconductor layer and a p-type GaN-based semiconductor layer, in which the p-type GaN-based semiconductor layer is provided with a translucent electrode formed thereon having plural through holes for light emission, to thereby reduce light absorbance of the translucent electrode and improve emission efficiency.

Incidentally, for improving light extraction efficiency of a semiconductor light emitting element, it is required to apply uniform voltage to an entire light emitting layer to pass uniform current through the entire light emitting layer. This suppresses unevenness in light emission on a light emitting surface of the semiconductor light emitting element and improves the light extraction efficiency.

However, due to a potential gradient generated in response to current diffusion in a surface direction of the translucent electrode, the voltage applied to the light emitting layer varies depending on a position in the light emitting surface of the light emitting layer.

It is an object of the present invention to provide a semiconductor light emitting element that suppresses non-uniformity in light emission on a light emitting surface thereof.

SUMMARY

According to an aspect of the present invention, there is provided a semiconductor light emitting element including: a first semiconductor layer composed of a group III-V semiconductor having a first conduction type; a light emitting layer composed of a group III-V semiconductor, which is provided on and in contact with the first semiconductor layer, the light emitting layer emitting light by passing a current; a second semiconductor layer composed of a group III-V semiconductor having a second conduction type that is opposite to the first conduction type, the second semiconductor layer being provided on and in contact with the light emitting layer; a translucent electrode film provided on and in contact with the second semiconductor layer, the translucent electrode film having permeability to the light emitted from the light emitting layer; a first electrode provided on and in contact with part of the translucent electrode film, the first electrode serving as one of terminals for passing a current through the light emitting layer; and a second electrode connected to the first semiconductor layer and provided on the same surface side with the first electrode, the second electrode serving as the other one of the terminals for passing a current through the light emitting layer, wherein any one of the first electrode and the second electrode is positioned at a center portion in a planar shape of the light emitting layer, the other one of the first electrode and the second electrode includes a connecting portion to which a voltage is applied from outside and an extending portion that extends from the connecting portion to face at least part of a periphery of the any one of the first electrode and the second electrode, the extending portion being set at the voltage, and the translucent electrode film is divided into plural regions that continue from the first electrode toward the second electrode, and a resistance in an in-plane direction in each of the plural regions is set to be increased in order from a region that is adjacent to the first electrode toward a region that is adjacent to the second electrode.

In such a semiconductor light emitting element, the resistance in the in-plane direction in each of the plural regions of the translucent electrode film is set by providing plural holes in the translucent electrode film such that at least one of a size and a density of the plural holes is varied.

The first conduction type is an n-type and the second conduction type is a p-type.

Moreover, the resistance in the in-plane direction in each of the plural regions of the translucent electrode film is set by providing the translucent electrode film to have a variation in thickness thereof.

Further, the translucent electrode film is composed of a conductive oxide material.

According to the present invention, it is possible to provide a semiconductor light emitting element that suppresses non-uniformity in light emission on a light emitting surface thereof.

BRIEF DESCRIPTION OF THE DRAWINGS

Exemplary embodiments of the present invention will be described in detail based on the following figures, wherein.

DETAILED DESCRIPTION

Hereinafter, exemplary embodiments according to the present invention will be described in detail with reference to accompanying drawings.

[First Exemplary Embodiment]

Figure 1:
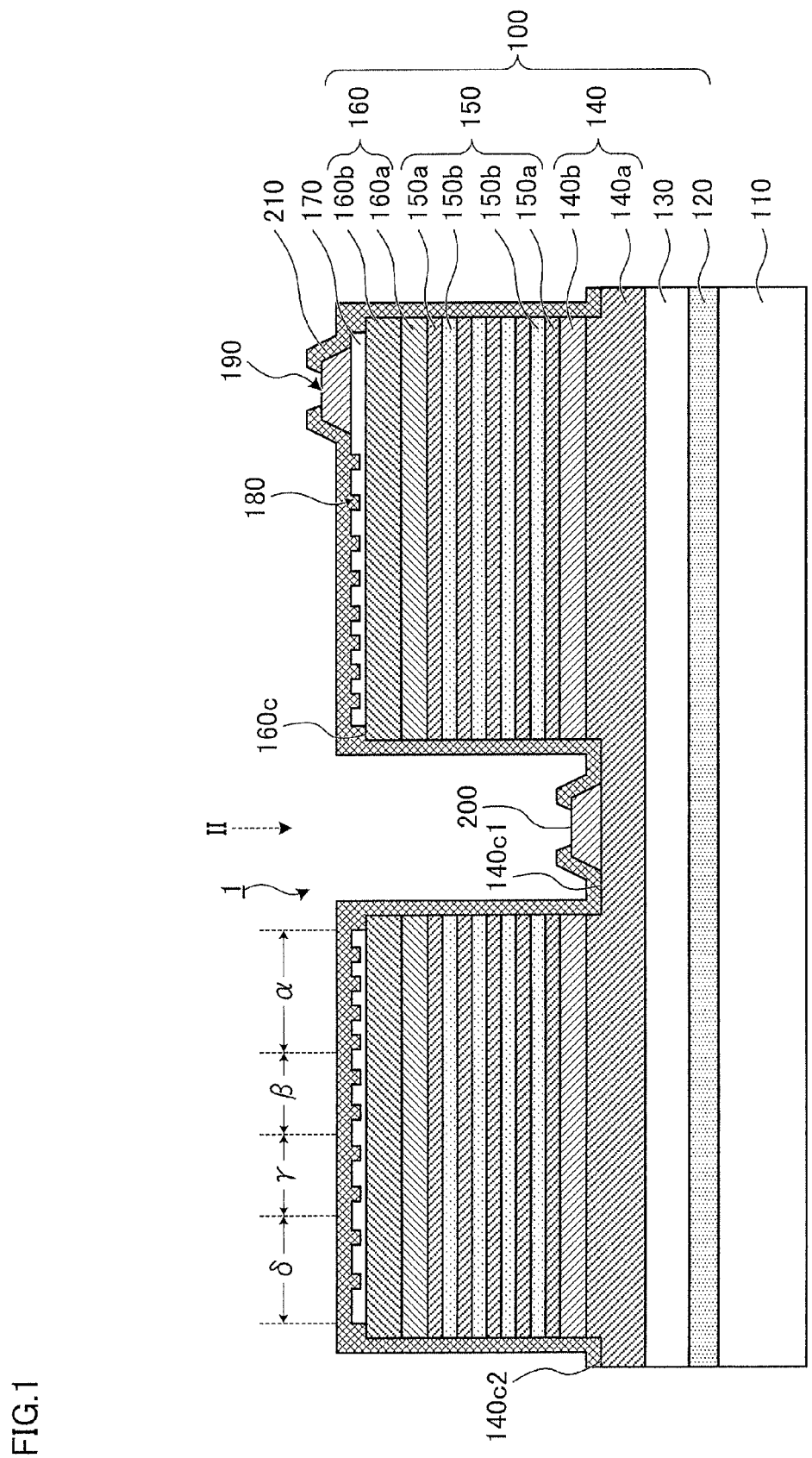
FIG. 1 is a diagram illustrating an example of a cross-sectional schematic view of a semiconductor light emitting element to which a first exemplary embodiment is applied.
Figure 2:
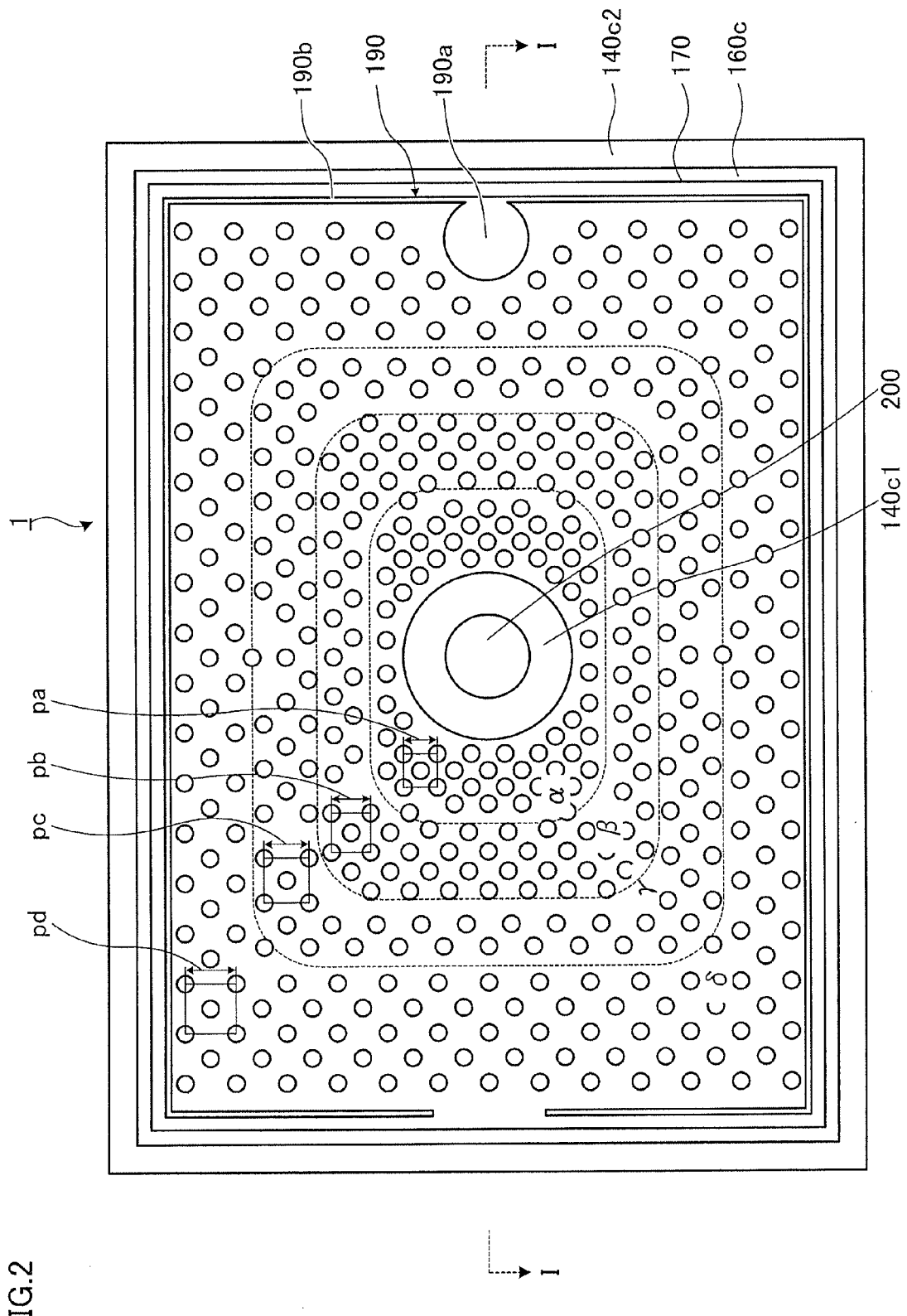
FIG. 2 is a diagram illustrating an example of a planar schematic view of the semiconductor light emitting element shown in FIG. 1.

FIG. 1 is an example of a cross-sectional schematic view of a semiconductor light emitting element 1 to which a first exemplary embodiment is applied, and FIG. 2 is an example of a planar schematic view of the semiconductor light emitting element 1 shown in FIG. 1. It should be noted that the cross-sectional schematic view of the semiconductor light emitting element 1 shown in FIG. 1 is a cross-sectional view cut along the I-I line in FIG. 2, and the planar schematic view of the semiconductor light emitting element 1 shown in FIG. 2 is a planar schematic view as viewed from the direction of arrow II in FIG. 1.

(Semiconductor Light Emitting Element 1)

As shown in FIG. 1, the semiconductor light emitting element 1 includes: a substrate 110; an intermediate layer 120 laminated on the substrate 110; and a base layer 130 laminated on the intermediate layer 120. The semiconductor light emitting element 1 also includes: an n-type semiconductor layer 140, as an example of a first semiconductor layer, laminated on the base layer 130; a light emitting layer 150 laminated on the n-type semiconductor layer 140; and a p-type semiconductor layer 160, as an example of a second semiconductor layer, laminated on the light emitting layer 150. It should be noted that, in the following description, these intermediate layer 120, base layer 130, n-type semiconductor layer 140, light emitting layer 150 and p-type semiconductor layer 160 will be collectively referred to as a laminated semiconductor layer 100 as necessary.

It should be noted that each of the n-type semiconductor 140, the light emitting layer 150 and the p-type semiconductor layer 160 is further configured with plural layers. These will be described in detail later.

Moreover, the semiconductor light emitting element 1 includes a translucent electrode film 170 that is laminated on a top surface 160c of the laminated semiconductor layer 100 and has permeability to light emitted from the light emitting layer 150.

The semiconductor light emitting element 1 also includes a p-electrode 190, as an example of a first electrode, which is laminated on part of the translucent electrode film 170 and semiconductor exposure surfaces 140c1 and 140c2 of the n-type semiconductor layer 140 exposed by cutting out a part of each of the p-type semiconductor layer 160, the light emitting layer 150 and the n-type semiconductor layer 140. The semiconductor exposure surface 140c1 is provided at a center portion of a planar shape, which is rectangle (refer to FIG. 2), and the semiconductor exposure surface 140c2 is provided at a peripheral portion of the rectangle (also refer to FIG. 2). The semiconductor light emitting element 1 further includes an n-electrode 200, as an example of a second electrode, which is laminated on the semiconductor exposure surface 140c1.

Each of the p-electrode 190 and the n-electrode 200 serves as a terminal for passing a current through the light emitting layer 150.

The translucent electrode film 170 includes plural holes 180 made from the surface side thereof (a surface farthest from the p-type semiconductor layer 160) toward the depth direction. In the first exemplary embodiment, the translucent electrode film 170 is divided into regions α, β, γ and δ from the n-electrode 200 to the p-electrode 190 (a connecting portion 190a and an extending portion 190b) (refer to FIG. 2. In FIG. 1, the regions α, β, γ and δ are indicated only in the left side of the space). The plural holes 180 provided in each of the regions α, β, γ and δ have the same diameter, but are different in the number of the holes 180 per unit area (density). In other words, the density of the holes 180 is the highest in the region α, which surrounds and is adjacent to the n-electrode 200, and the density of the holes 180 is the lowest at the region δ that is adjacent to the p-electrode 190 (the connecting portion 190a and the extending portion 190b).

In the first exemplary embodiment, the holes 180 are dug from the surface of the translucent electrode film 170, but do not reach the p-type semiconductor layer 160. In other words, the holes 180 are not through holes. Consequently, the back surface of the translucent electrode film 170 (the surface closer to the p-type semiconductor layer 160) entirely contacts the surface of the p-type semiconductor layer 160 (the top surface 160c of the laminated semiconductor layer 100).

In contrast, in a case where the holes 180 penetrate the translucent electrode film 170, the area of the back surface of the translucent electrode film 170 that is brought into contact with the surface of the p-type semiconductor layer 160 (the top surface 160c of the laminated semiconductor layer 100) is reduced, and accordingly, contact resistance is increased compared to the case where the holes 180 are not the through holes.

That is, in the first exemplary embodiment, the contact resistance between the translucent electrode film 170 and the p-type semiconductor layer 160 is reduced by causing the holes 180 not to penetrate the translucent electrode film 170.

It should be noted that, in a case where there is no problem with the contact resistance, the holes 180 may penetrate the translucent electrode film 170.

Further, the semiconductor light emitting element 1 includes a protecting layer 210 that covers the top surface of the translucent electrode film 170 and the top and side surfaces of the laminated semiconductor layer 100 except for part (an opening portion) of the top surface of each of the p-electrode 190 and the n-electrode 200. It should be noted that, in FIG. 1, the protecting layer 210 is indicated to be embedded in the holes 180 such that the top surface thereof (the surface farthest from the translucent electrode film 170) is flat. However, the protecting layer 210 covers the side surface (the inner wall) and the bottom surface of the holes 180 along the cross-sectional shape of the holes 180 of the translucent electrode film 170. In other words, the surface of the protecting layer 210 is a surface with asperities that follows the shape of the holes 180.

As shown in FIG. 2, the planar shape of the semiconductor light emitting element 1 is, for example, rectangular. The planar shape of the semiconductor light emitting element 1 is, for example, 350 µm×850 µm.

By cutting out part of each of the p-type semiconductor layer 160, the light emitting layer 150 and the n-type semiconductor layer 140 in the laminated semiconductor layer 100, the semiconductor exposure surfaces 140c1 and 140c2 to expose the n-type semiconductor layer 140 are provided. As described above, the semiconductor exposure surface 140c1 is provided at a center portion of the rectangular semiconductor light emitting element 1, and the semiconductor exposure surface 140c2 is provided at a peripheral portion of the rectangular semiconductor light emitting element 1.

In addition, the semiconductor light emitting element 1 includes the n-electrode 200 on the semiconductor exposure surface 140c1.

It should be noted that the planar shape of the semiconductor exposure surface 140c1 is assumed to be circular, as an example, and the planar shape of the n-electrode 200 is also assumed to be circular. In other words, the planar shape of the laminated semiconductor layer 100 of the semiconductor light emitting element 1 is rectangular at the outer side, and a circular hole is provided at the center thereof.

The translucent electrode film 170 is provided to cover almost all the top surface 160c of the laminated semiconductor layer 100. In other words, the planar shape of the translucent electrode film 170 is, corresponding to the planar shape of the laminated semiconductor layer 100, rectangular at the outer side, and the center thereof is circularly hollowed out.

The holes 180 are provided in the translucent electrode film 170. As an example, the planar shape of the hole 180 as viewed from the top surface side of the translucent electrode film 170 is circular. The holes 180 are provided such that the density thereof is reduced along with a move from the n-electrode 200 side toward the p-electrode 190 (a connecting portion 190a and an extending portion 190b) side.

The holes 180 will be described in detail later.

The p-electrode 190 is provided on the translucent electrode film 170. It should be noted that the p-electrode 190 includes the connecting portion 190a, whose planar shape is circular, and the extending portion 190b that extends from the connecting portion 190a like a long and slender strip to face the n-electrode 200 as if surrounding the n-electrode 200.

As shown in FIG. 2, the connecting portion 190a is provided at one end portion on the translucent electrode film 170, whose outer shape is rectangular, in the longitudinal direction thereof. A bonding wire or the like is connected to the connecting portion 190a, and accordingly, a predetermined voltage is applied thereto from a power supply provided externally. It should be noted that the outer shape of the connecting portion 190a is, for example, a circle with a diameter of 70 µm.

On the other hand, the extending portion 190b is formed on the translucent electrode film 170 to extend from the connecting portion 190a and provided along the outer periphery of the translucent electrode film 170. The connecting portion 190a and the extending portion 190b of the p-electrode 190 are, as will be described later, configured with materials having specific resistivity smaller than that of the translucent electrode film 170. Consequently, the extending portion 190b applies the voltage, which has been applied to the connecting portion 190a, to the translucent electrode film 170 with voltage drop smaller than that in a case where the no extending portion 190b is provided. In other words, it is only necessary for the extending portion 190b to apply the voltage having been applied to the connecting portion 190a to the translucent electrode film 170 with small voltage drop.

In the extending portion 190b, as shown in FIG. 2, it is not required to connect the farthest portions thereof (the left side of the space in FIG. 2) split in two and extending from the connecting portion 190a each other. Moreover, it is unnecessary for the extending portion 190b to be provided at the outer peripheral portion on one side of the translucent electrode film 170 having a rectangular outer shape, which is farthest from the connecting portion 190a (the left side of the space in FIG. 2). In other words, it is only necessary for the extending portion 190b to be provided along the outer peripheral portions on the three sides of the rectangle (the right side and vertical sides of the space in FIG. 2).

Conversely, the extending portion 190b may be provided continuously so as to encircle along the outer rim of the translucent electrode film 170.

Since the extending portion 190b is not connected to the bonding wire, the width of the extending portion 190b may be narrower than the width of the connecting portion 190a.

Moreover, the n-electrode 200 is, for example, of a circular shape with a diameter of 70 µm. The n-electrode 200 is connected to a bonding wire or the like, and other predetermined negative voltage, opposed to the voltage applied to the p-electrode 190, is applied to the n-electrode 200 from a power supply provided at the outside.

Here, the holes 180 provided in the translucent electrode film 170 will be described.

The path of the current (current diffusion), which flows, while diffusing within the surfaces of the translucent electrode film 170, in a direction parallel to the surfaces (the top surface and the back surface) (the surface direction) is hindered by the holes 180 having been provided. Accordingly, in the translucent electrode film 170 of a predetermined area including the plural holes 180, the resistance to the current diffusion flowing within the surfaces in the surface direction is large compared to the case where the holes 180 are not provided. Further, the higher the density of the holes 180, the larger the resistance becomes.

In general, in a thin film or the like, the resistance to the current flowing within the surfaces in the surface direction is referred to as a sheet resistance. Accordingly, in the translucent electrode film 170 including the plural holes 180, the resistance to the current diffusion flowing within the surfaces in the surface direction is a sheet resistance of a region including the plural holes 180 (an equivalent sheet resistance). Here, in the translucent electrode film 170 of a predetermined area including the plural holes 180, the resistance to the current diffusion flowing within the surfaces in the surface direction is represented as "resistance to the current diffusion in the translucent electrode film 170".

In other words, in the first exemplary embodiment, by providing the holes 180 in the translucent electrode film 170, the resistance to the current diffusion in the translucent electrode film 170 is controlled and the density of the holes 180 is varied depending on the position on the surface of the translucent electrode film 170, to thereby provide a setting in which the resistance to the current diffusion in the translucent electrode film 170 is varied.

The planar shape of each of the holes 180 may not be circular, but may be ecliptic, polygonal or the like.

In the first exemplary embodiment, as shown in FIG. 2, the translucent electrode film 170 is divided into four regions (regions α, β, γ and δ) having different densities of the holes 180. The region α is provided to encircle the n-electrode 200, the region β is provided to encircle the region α, the region γ is provided to encircle the region β, and the region δ is provided outside thereof. On the region δ, the connecting portion 190a and the extending portion 190b of the p-electrode 190 are provided.

The holes 180 have the same radius and are provided such that the center of each hole 180 is positioned at each of vertices and a center of a square, which has different side length in each of the regions (regions α, β, γ and δ). In other words, the square in the region α has a side with the length of pa, the square in the region β has a side with the length of pb, which is longer than pa, the square in the region γ has a side with the length of pc, which is longer than pb, and the square in the region δ has a side with the length of pd, which is longer than pc (pa<pb<pc<pd).

In other words, the density of the holes 180 is decreased along with a move from the region α toward the region δ.

Corresponding to the density of the holes 180, the resistance to the current diffusion in the translucent electrode film 170 varies.

It should be noted that the translucent electrode film 170 is divided into four regions here; however, there may be at least two regions. Moreover, the translucent electrode film 170 is not necessarily divided into the regions, and the density of the holes 180 may be continuously varied to be decreased along with a move from the n-electrode 200 toward the p-electrode 190. Further, in the region where the density of the holes 180 is low (the region 8 in FIG. 2), the holes 180 are not necessarily provided.

Boundaries between the regions are not necessarily marked explicitly.

Further, the centers of the holes 180 are assumed to be positioned at the vertices and the center of a square; however, the centers of the holes 180 may be provided at vertices of other polygons, or may be arranged randomly.

In the semiconductor light emitting element 1, by applying a voltage between the p-electrode 190 and the n-electrode 200, a current is passed through the p-type semiconductor layer 160, the light emitting layer 150 and the n-type semiconductor layer 140 via the p-electrode 190 and the n-electrode 200, to thereby emit light from the light emitting layer 150, and the light is extracted through the translucent electrode film 170. In other words, the top surface 160c of the laminated semiconductor layer 100 is a light emitting surface of the semiconductor light emitting element 1.

Next, each component of the semiconductor light emitting element 1 will be described in detail with reference to FIGS. 1 and 2.

<Substrate 110>

The substrate 110 is not limited as long as a crystal of a group III-V semiconductor is epitaxially grown on a surface thereof, and is selected from various kinds of substrates to be used. For example, a substrate composed of sapphire, SiC, silicon, germanium, GaAs, GaP, GaN, zinc oxide or the like can be used. Moreover, after the laminated semiconductor layer 100 or the like is epitaxially grown on the substrate, another substrate of other material is bonded thereto, and thereafter, the substrate on which the laminated semiconductor layer 100 has been epitaxially grown is removed, to thereby cause the substrate made of other material to be the substrate 110.

In a case of a crystal of a group III nitride semiconductor, of the materials described above, in particular, it is preferable to use sapphire, in which a c-plane is a principal plane, as the substrate 110. In the case where sapphire is used as the substrate 110, it is preferable to form an intermediate layer (a buffer layer) 120 on the c-plane of sapphire because a crystal having a different lattice constant can be grown with excellent quality.

Hereinafter, description will be given of the group III nitride semiconductor as an example of the group III-V semiconductor.

<Laminated Semiconductor Layer 100>

The laminated semiconductor layer 100 is a layer composed of the group III nitride semiconductor, and as shown in FIG. 1, configured by laminating the intermediate layer 120, a base layer 130, the n-type semiconductor layer 140, the light emitting layer 150 and the p-type semiconductor layer 160 on the substrate 110 in this order.

Moreover, as shown in FIG. 1, each of the n-type semiconductor layer 140, the light emitting layer 150 and the p-type semiconductor layer 160 may be configured by plural semiconductor layers. Here, the n-type semiconductor layer 140 performs electrical conduction of a first conduction type in which an electron is a carrier, while the p-type semiconductor layer 160 performs electrical conduction of a second conduction type in which a hole is a carrier.

It should be noted that the laminated semiconductor layer 100 with excellent crystallinity can be obtained by forming by an MOCVD method; however, a sputtering method under optimized conditions can form a semiconductor layer having more excellent crystallinity than that formed by the MOCVD method. Hereinafter, description will be given in order.

<Intermediate Layer 120>

The intermediate layer 120 is preferably composed of polycrystal $Al_xGa_{1-x}N$ ($0 \leq x \leq 1$), and more preferably, composed of single crystal $Al_xGa_{1-x}N$ ($0 \leq x \leq 1$).

The intermediate layer 120 can be, for example, as described above, configured with polycrystal $Al_xGa_{1-x}N$ ($0 \leq x \leq 1$) with a thickness of 0.01 μm to 0.5 μm. If the thickness of the intermediate layer 120 is less than 0.01 μm, there are some cases where an effect to mediate the difference in lattice constant between the substrate 110 and the base layer 130 cannot be sufficiently obtained. On the other hand, if the thickness of the intermediate layer 120 is more than 0.5 μm, there is a possibility that the time of forming process of the intermediate layer 120 becomes longer though there is no change to the function of the intermediate layer 120, and accordingly the productivity is decreased.

The intermediate layer 120 mediates the difference in lattice constant between the substrate 110 and the base layer 130. In particular, in the case where the substrate 110 is composed of a sapphire whose c-plane is a principal plane, serves to facilitate the formation of a single crystal layer which is C-axis oriented on the (0001) plane (the c-plane) of the substrate 110. Consequently, if a single crystal base layer 130 is laminated on the intermediate layer 120, the base layer 130 having more excellent crystallinity can be laminated. It should be noted that formation of the intermediate layer 120 is preferably carried out in the present invention, but the intermediate layer 120 may not be formed.

Moreover, the intermediate layer 120 may have a crystal structure of a hexagonal system composed of the group III nitride semiconductor. The crystal of the group III nitride semiconductor constituting the intermediate layer 120 may be a crystal having a single crystal structure, and the crystal having a single crystal structure is preferably used. Crystals of the group III nitride semiconductor grow not only in an upper direction but also in an in-plane direction to form a single crystal structure by controlling growing conditions. Accordingly, the intermediate layer 120 can be composed of the group III nitride semiconductor crystals having single crystal structure by controlling layer forming conditions of the intermediate layer 120. In the case where the intermediate layer 120 having such a single crystal structure is formed on the substrate 110, the buffer function of the intermediate layer 120 effectively works, and thereby the group III nitride semiconductor formed thereon becomes a crystal film having excellent orientation property and crystallinity.

Further, it is possible to provide the group III nitride semiconductor crystals constituting the intermediate layer 120 as columnar crystals (polycrystals) composed of an aggregate structure based on hexagonal columns by controlling layer forming conditions. It should be noted that the columnar crystals composed of an aggregate structure described here refers to crystals which are separated from adjacent crystal grains by crystal grain boundaries formed therebetween, and are columnar by themselves in a longitudinal sectional shape.

<Base Layer 130>

As the base layer 130, $Al_xGa_yIn_zN$ ($0 \leq x \leq 1$, $0 \leq y \leq 1$, $0 \leq z \leq 1$, $x+y+z=1$) can be used, but it is preferable to use $Al_xGa_{1-x}N$ ($0 \leq x < 1$) because the base layer 130 with excellent crystallinity can be formed.

The thickness of the base layer 130 is preferably 0.1 μm or more, more preferably 0.5 μm or more, and most preferably 1 μm or more. The base layer 130 having excellent crystallinity is likely to be obtained with these layer thickness or more.

To improve the crystallinity of the base layer 130, it is desirable that the base layer 130 is not doped with impurities. However, if conductivity of p-type or n-type is needed, p-type impurities (acceptor impurities) or n-type impurities (donor impurities) can be added to the base layer 130.

<N-Type Semiconductor Layer 140>

As shown in FIG. 1, it is preferable that the n-type semiconductor layer 140 is configured with an n-contact layer 140a and an n-cladding layer 140b. It should be noted that the n-contact layer 140a can also serve as the n-cladding layer 140b. Moreover, the above-described base layer 130 may be included in the n-type semiconductor layer 140.

The n-contact layer 140a is a layer for providing the n-electrode 200. The n-contact layer 140a is preferably configured with the $Al_xGa_{1-x}N$ layer ($0 \leq x < 1$, more preferably $0 \leq x \leq 0.5$, and still more preferably $0 \leq x \leq 0.1$).

Moreover, the n-contact layer 140a is preferably doped with n-type impurities, and it is preferable to contain the n-type impurities having a concentration of $1 \times 10^{17}/cm^3$ to $1 \times 10^{20}/cm^3$, and a concentration of $1 \times 10^{18}/cm^3$ to $1 \times 10^{19}/cm^3$ is more preferable on the point that a good ohmic contact with the n-electrode 200 can be maintained. As the n-type impurities, though not particularly limited, Si, Ge, Sn and so on are provided, and Si and Ge are preferably provided.

The thickness of the n-contact layer 140a is preferably set at 0.5 μm to 5 μm, and more preferably set in a range of 1 μm to 3 μm. If the thickness of the n-contact layer 140a is in the above-described ranges, crystallinity of the light emitting layer 150 is suitably maintained.

Further, the product (Nd) of the concentration of impurities in the n-contact layer 140a and the thickness of the n-contact layer 140a is in an inversely proportional relation with an electrical resistance of the n-contact layer 140a, and to equalize the current density in the light emitting layer 150 and reduce the forward voltage Vf, the product (Nd) is in a range of $1 \times 10^{14}/cm^2$ to $1 \times 10^{16}/cm^2$, and desirably in a range of $2 \times 10^{14}/cm^2$ to $5 \times 10^{15}/cm^2$. If the value of the product is too small, an amount of light (a current density) of a region adjacent to (near) the n-electrode 200 becomes large. On the other hand, if the value of the product is too large, an amount of light (a current density) on a side near the p-electrode 190 becomes large, and deterioration of quality of crystals in the n-contact layer 140a is caused to result in a deterioration of electrostatic breakdown voltage.

It is preferable to provide the n-cladding layer 140b between the n-contact layer 140a and the light emitting layer 150. The n-cladding layer 140b performs injection of the carriers into the light emitting layer 150 and confinement of the carriers within the light emitting layer 150. The n-cladding layer 140b can be formed of AlGaN, GaN, GaInN and so on. Further, the hetero junction structure or the superlattice structure in which the layer is laminated plural times of these structures may also be used. When the n-cladding layer 140b is formed of GaInN, the band gap thereof is preferably larger than that of GaInN of the light emitting layer 150. It should be noted that, in this specification, materials are referred to as, for example, AlGaN or GaInN with the compositional ratio of each element omitted.

The thickness of the n-cladding layer 140b is not particularly limited, but preferably in a range of 5 nm to 500 nm, and more preferably in a range of 5 nm to 100 nm. The n-type impurity concentration of the n-cladding layer 140b is preferably in a range of $1 \times 10^{17}/cm^3$ to $1 \times 10^{20}/cm^3$, and more preferably in a range of $1 \times 10^{18}/cm^3$ to $1 \times 10^{19}/cm^3$. It is preferable to provide the impurity concentration in these ranges in terms of maintaining excellent crystallinity and reducing operation voltage of the element.

It should be noted that, in the case where the n-cladding layer 140b is a layer containing the superlattice structure, the layer may contain a structure in which an n-side first layer composed of the group III nitride semiconductor with a thickness of 10 nm or less and an n-side second layer composed of the group III nitride semiconductor having a composition different from that of the n-side first layer and having a thickness of 10 nm or less are laminated.

Further, the n-cladding layer 140b may contain a structure in which the n-side first layers and the n-side second layers are alternately and repeatedly laminated, and the structure is preferably an alternating structure of GaInN and GaN or an alternating structure of GaInN having different compositions.

<Light Emitting Layer 150>

As the light emitting layer 150 laminated on the n-type semiconductor layer 140, it is desirable to employ a single quantum well structure or a multiple quantum well structure.

In FIG. 1, the light emitting layer 150 is indicated as the multiple quantum well structure in which barrier layers 150a and well layers 150b are alternately laminated. Of the light emitting layer 150, each of the layers that are in contact with the n-cladding layer 140b and a p-cladding layer 160a, which will be described later, is the barrier layer 150a. As the well layer 150b having a multiple quantum well structure, the group III nitride semiconductor layer composed of $Ga_{1-y}In_yN$ ($0<y<0.4$) is usually used. The thickness of the well layer 150b may be the thickness by which quantum effects can be obtained, for example, 1 nm to 10 nm, and preferably 2 nm to 6 nm in terms of light emission output.

Moreover, in the case of employing the light emitting layer 150 having the multiple quantum well structure, the above-described $Ga_{1-y}In_yN$ is employed as the well layer 150b, and $Al_zGa_{1-z}N$ ($0 \leq z < 0.3$) having band gap energy larger than that of the well layer 150b is employed as the barrier layer 150a. The well layer 150b and the barrier layer 150a may be doped or not doped with impurities depending upon a design thereof.

<P-Type Semiconductor Layer 160>

The p-type semiconductor layer 160 is usually configured with a p-cladding layer 160a and a p-contact layer 160b. Further, the p-contact layer 160b can also serve as the p-cladding layer 160a.

The p-cladding layer 160a performs confinement of carriers within the light emitting layer 150 and injection of carriers into the light emitting layer 150. The material of p-cladding layer 160a is not particularly limited as long as the band gap energy of the composition thereof is larger than that of the light emitting layer 150 and carriers can be confined within the light emitting layer 150, but can be composed of, for example, $Al_xGa_{1-x}N$ (0<x≤0.4).

It is preferable that the p-cladding layer 160a is composed of such AlGaN in terms of confinement of carriers within the light emitting layer 150. The thickness of the p-cladding layer 160a is not particularly limited, but preferably 1 nm to 400 nm, and more preferably 5 nm to 100 nm.

The p-type impurity concentration of the p-cladding layer 160a is preferably $1×10^{18}/cm^3$ to $1×10^{21}/cm^3$, and more preferably $1×10^{19}/cm^3$ to $1×10^{20}/cm^3$. If the p-type impurity concentration is in the above ranges, an excellent p-cladding layer 160a can be obtained without deteriorating crystallinity.

Moreover, the p-cladding layer 160a may have a superlattice structure in which the layer is laminated plural times, and in this case, preferably has an alternating structure of AlGaN and another AlGaN having different composition ratio or has an alternating structure of AlGaN and GaN having different composition.

The p-contact layer 160b is a layer for providing the translucent electrode film 170. The p-contact layer 160b is preferably composed of $Al_xGa_{1-x}N$ (0≤x≤0.4). It is preferable that Al composition is in the above-described range in terms of allowing to maintain excellent crystallinity and good ohmic contact with the translucent electrode film 170.

It is preferable for the p-contact layer 160b to contain p-type impurities in a concentration of $1×10^{18}/cm^3$ to $1×10^{21}/cm^3$, and preferably $5×10^{19}/cm^3$ to $5×10^{20}/cm^3$ in terms of maintaining good ohmic contact, preventing cracking and maintaining excellent crystallinity. The p-type impurities are not particularly limited, but, for example, Mg is preferably provided.

The thickness of the p-contact layer 160b is not particularly limited, but is preferably 10 nm to 500 nm, and more preferably 50 nm to 200 nm. It is preferable to provide the thickness of the p-contact layer 160b in these ranges because the forward voltage is reduced and the amount of light to be emitted is increased.

Moreover, the p-contact layer 160b may be configured with two layers, namely, a p-side first layer and a p-side second layer, and may cause the p-side first layer to have low sheet resistance by reducing the amount of Mg to be added to the p-side first layer, which is in contact with the p-cladding layer 160a, compared to the amount of Mg to be added to the p-side second layer, which is in contact with the translucent electrode film 170.

The contact resistance is reduced in proportion to the amount of Mg to be added; however, for the sheet resistance, there is an appropriate range of the amount of Mg to be added, and if Mg is excessively added, the resistance is increased. Accordingly, it is desirable to reduce both contact resistance and sheet resistance by dividing the p-contact layer 160b into two layers.

This makes it possible to reduce the sheet resistance of the p-type semiconductor layer 160 and also reduce the contact resistance between the p-type semiconductor layer 160 and the translucent electrode film 170.

<Translucent Electrode Film 170>

As shown in FIG. 1, the translucent electrode film 170 is laminated on the p-type semiconductor layer 160.

As shown in FIG. 2, when viewed in a planar view, the translucent electrode film 170 is formed to cover almost all the top surface 160c of the laminated semiconductor layer 100 that has been partially removed by etching or the like to form the n-electrode 200.

It is preferable that the translucent electrode film 170 has small contact resistance with the p-type semiconductor layer 160. Moreover, in the semiconductor light emitting element 1, since light emitted from the light emitting layer 150 is extracted at a side where the p-electrode 190 is formed through the translucent electrode film 170, it is preferable that the translucent electrode film 170 has excellent permeability to the light emitted from the light emitting layer 150. Further, for uniformly diffusing a current all over the surface of the p-type semiconductor layer 160, it is preferable that the translucent electrode film 170 has excellent conductivity compared to the p-type semiconductor layer 160 (the p-contact layer 160b).

From above, as the translucent electrode film 170, a conductive oxide material including indium (In) is used. Part of oxides containing In is preferable in the point that both optical permeability and conductivity are excellent in comparison with other translucent electrode film. Specific examples of conductive oxides containing In include: ITO (indium tin oxide ($In_2O_3$—$SnO_2$)); IZO (indium zinc oxide ($In_2O_3$—ZnO)); IGO (indium gallium oxide ($In_2O_3$—$Ga_2O_3$)); and ICO (indium cerium oxide ($In_2O_3$—$CeO_2$)). It should be noted that impurities such as fluorine may be added to these materials.

By depositing these materials as a film by a method known in the technical field and processing (patterning) thereof by a known method, it is possible to form the translucent electrode film 170 provided with the holes 180 that are made from the surface.

Further, there are some cases where thermal annealing is performed for improving transparency and reducing resistance of the translucent electrode film 170 after forming the translucent electrode film 170 provided with the holes 180.

As the translucent electrode film 170, those having a crystallized structure may be used, and in particular, ITO or IZO that has high optical permeability and small specific resistance and contains $In_2O_3$ crystals having a crystal structure of a hexagonal system or a bixbyite structure can be preferably used.

For example, in the case where IZO containing $In_2O_3$ crystals having a crystal structure of a hexagonal system is used as the translucent electrode film 170, an IZO film in an amorphous state that has an excellent etching property can be used and processed into the translucent electrode film 170, and thereafter, processed into the translucent electrode film 170 that is excellent in optical permeability than the IZO film in the amorphous state by transferring the amorphous state into a structure containing crystals through a heat treatment or the like.

Further, as the IZO film, it is preferable to use a composition showing the lowest specific resistance.

For example, a ZnO concentration in IZO is preferably 1% by mass to 20% by mass, and more preferably in a range of 5% by mass to 15% by mass. 10% by mass is especially preferred. Moreover, the thickness of the IZO film is preferably in a range of 35 nm to 10000 nm (10 μm), which can provide low contact resistance and high optical permeability. If the thickness is smaller than 35 nm, the contact resistance is increased. In terms of production costs and reduction in optical transmittance, it is preferable that the thickness of the IZO film (the thickness of the film other than the portions of the holes 180) is not more than 1000 nm (1 μm). Further, the optimum thickness is 50 nm to 400 nm by which low contact resistance and high optical permeability are provided.

In the case where the holes 180 are not provided for making the current density uniform, it is desirable that the sheet resistance of the IZO film is in a range of 5Ω per square to 50Ω per square, and more desirably, in a range of 10Ω per square to 40Ω per square. If the sheet resistance is high, the forward voltage is increased and thereby the light emission efficiency is deteriorated. If the sheet resistance is excessively low, the current density near the n-electrode 200 becomes high, and thereby efficiency of the semiconductor light emitting element 1 as a whole is deteriorated.

In the case where the planar shape of the hole 180 is circular, the diameter of the hole 180 is preferably in a range of 1 μm to 10 μm, and more preferably, in a range of 2 μm to 5 μm. If the diameter is less than 1 μm, wide variation in the diameter of the hole 180 is caused, and accordingly, uniform current density is hardly obtained. On the other hand, if the diameter of the hole 180 is more than 10 μm, current supply to the light emitting layer 150 becomes non-uniform due to the difference in the current density between the proximity of the hole 180 and a portion away from the hole 180, and thereby efficiency of the semiconductor light emitting element 1 as a whole is deteriorated.

It is desirable to form the holes 180 in the IZO film prior to performing a heat treatment. Since the IZO film in the amorphous state is changed into the crystallized IZO film by the heat treatment, it becomes difficult to perform etching on the crystallized IZO film compared to the IZO film in the amorphous state. In contrast, since the IZO film before being subjected to the heat treatment is in the amorphous state, it is possible to perform patterning with high accuracy by use of an etchant.

The holes 180 may be formed in the IZO film in the amorphous state by use of a dry-etching device. At that time, $Cl_2$, $SiCl_4$, $BCl_3$ or the like can be used as an etching gas. The IZO film in the amorphous state can be changed into the IZO film containing $In_2O_3$ crystals having a crystal structure of a hexagonal system or the IZO film containing $In_2O_3$ crystals having a bixbyite structure, for example, by carrying out a heat treatment at 500° C. to 1000° C. and controlling conditions. Since the IZO film containing $In_2O_3$ crystals having a crystal structure of a hexagonal system is difficult to be etched as described above, it is preferable to perform the heat treatment after the holes 180 are formed.

In particular, as described above, since the IZO film crystallized by the heat treatment has excellent adhesive properties with the p-electrode 190 and the p-type semiconductor layer 160 compared to the IZO film in the amorphous state, the crystallized IZO film is effective in the exemplary embodiment according to the present invention.

<P-Electrode 190>

The p-electrode 190 formed on the translucent electrode film 170 and in ohmic contact with the translucent electrode film 170 is configured with a conventionally known material, such as Au, Al, Ti, V, Cr, Mn, Co, Zn, Ge, Zr, Nb, Mo, Ru, Ta, Ni, Pt, or Cu. The structure of the p-electrode 190 in the thickness direction is not particularly limited, and a conventionally known structure can be employed. The p-electrode 190 can be mounted by a conventionally known method in this technical field.

It should be noted that, here, the connecting portion 190a and the extending portion 190b of the p-electrode 190 have the same structure in the thickness direction.

For improving wire bonding properties, it is desirable not to provide the holes 180 in the translucent electrode film 170 beneath the connecting portion 190a of the p-electrode 190.

The thickness of the p-electrode 190 is, for example, in a range of 100 nm to 2000 nm, and preferably in a range of 300 nm to 1000 nm.

<N-Electrode 200>

The n-electrode 200 is in ohmic contact with the n-contact layer 140a of the n-type semiconductor layer 140. In other words, the n-electrode 200 is provided on the semiconductor layer exposure surface 140c that exposes the n-contact layer 140a by removing part of each of the p-type semiconductor layer 160, the light emitting layer 150 and the n-type semiconductor layer 140 of the laminated semiconductor layer 100.

The n-electrode 200 may have the same composition and structure as the p-electrode 190. The n-electrodes 200 with various compositions and structures are conventionally known, and these n-electrodes 200 can be used without any limitation. The n-electrode 200 can be provided by a conventionally known method in this technical field.

<Protecting Layer 210>

The protecting layer 210 is provided to cover the top surface of the translucent electrode film 170 and top and side surfaces of the laminated semiconductor layer 100, except for part of the top surface of each of the p-electrode 190 and the n-electrode 200, for suppressing entry of water or the like into the inside of the semiconductor light emitting element 1.

Moreover, in the first exemplary embodiment, since the light from the light emitting layer 150 is extracted through the protecting layer 210, it is desirable that the protecting layer 210 has excellent permeability to the light emitted from the light emitting layer 150. In the first exemplary embodiment, the protecting layer 210 is configured with $SiO_2$. However, the material constituting the protecting layer 210 is not limited thereto, and $TiO_2$, $Si_3N_4$, $SiO_2$—$Al_2O_3$, $Al_2O_3$, AlN or the like can be employed in place of $SiO_2$.

(Method of Manufacturing Semiconductor Light Emitting Element 1)

Next, description will be given of an example of a method of manufacturing the semiconductor light emitting element 1, which is the first exemplary embodiment.

First, the substrate 110 which is composed of sapphire or the like is prepared and is subjected to preprocessing. The preprocessing can be performed by a method of, for example, placing the substrate 110 in a chamber of a sputtering device and conducting sputtering before forming the intermediate layer 120. It is desirable to form the intermediate layer 120 by the sputtering method; however, the intermediate layer 120 may be formed by the MOCVD method.

After forming the intermediate layer 120, the base layer 130 of a single crystal is formed on the intermediate layer 120. The base layer 130 may be formed by the sputtering method or the MOCVD method.

After the base layer 130 is formed, the n-contact layer 140a and the n-cladding layer 140b are laminated on the base layer 130 to form the n-type semiconductor layer 140. The n-contact layer 140a and the n-cladding layer 140b may be formed by the sputtering method or by the MOCVD method.

Formation of the light emitting layer 150 may be performed by the known MOCVD method. Specifically, the barrier layers 150a and the well layers 150b may be alternately and repeatedly laminated and the barrier layers 150a are located to face the n-type semiconductor layer 140 and the p-type semiconductor layer 160.

Formation of the p-type semiconductor layer 160 may be performed by the known MOCVD method. Specifically, the p-cladding layer 160a and the p-contact layer 160b may be laminated in order on the light emitting layer 150.

On the p-type semiconductor layer 160, a film (an IZO film, an ITO film) constituting the translucent electrode film 170 is deposited by known methods such as the deposition method and the sputtering method, and is subjected to patterning by known methods, to thereby form the translucent electrode film 170 provided with the holes 180.

For example, on the top surface 160c of the laminated semiconductor layer 100, a film that constitutes the translucent electrode film 170 is deposited by the sputtering method or the like. Next, by a known photolithographic technology, the film constituting the translucent electrode film 170 is processed into a planar shape in which an outer shape is rectangular and the center thereof is circularly hollowed out. Further, by a known photolithographic technology, plural holes 180 are provided in the film constituting the translucent electrode film 170 having a planar shape in which the outer shape is rectangular and the center thereof is circularly hollowed out. At this time, the processing (etching) depth is controlled so that the holes 180 do not penetrate the translucent electrode film 170 in the thickness direction.

It should be noted that the step for processing the film of a material that constitutes the translucent electrode film 170 into the planar shape in which the outer shape is rectangular and the center thereof is circularly hollowed out and the step for forming the holes 180 may be replaced.

For preventing the holes 180 from penetrating through the film constituting the translucent electrode film 170, it is desirable that the etching process is performed by a dry-etching method that is excellent in micromachining and is able to control the depth with ease.

Moreover, in a case where the holes 180 penetrate through the translucent electrode film 170 in the thickness direction, the step for processing the film of a material that constitutes the translucent electrode film 170 into a pattern of the planar shape in which the outer shape is rectangular and the center thereof is circularly hollowed out and the step for forming the holes 180 can be performed at the same time.

Then, part of the laminated semiconductor film 100 is removed by a known method to expose part of the n-contact layer 140a, to thereby form the semiconductor layer exposure surfaces 140c1 and 140c2.

Then, as described above, the p-electrode 190 (the connecting portion 190a and the extending portion 190b) is formed on the translucent electrode film 170 and the n-electrode 200 is formed on the semiconductor layer exposure surface 140c.

Finally, except for part of the surface (an opening portion) of each of the p-electrode 190 and the n-electrode 200, the protecting layer 210 composed of $SiO_2$ is formed to cover the top surface of the translucent electrode film 170 and top and side surfaces of the laminated semiconductor layer 100.

By the steps described above, the semiconductor light emitting element 1 is obtained.

The semiconductor light emitting element 1 obtained in this manner may be subjected to a heat treatment with a temperature in a range of 150° C. to 600° C., and more preferably in a range of 200° C. to 500° C. in an inert atmosphere of, for example, nitrogen or the like. The heat treatment is performed for the purpose of improving adhesive properties between the translucent electrode film 170 and the p-electrode 190, improving adhesive properties between the n-electrode 200 and the semiconductor layer exposure surface 140c1, improving optical transmittance of the translucent electrode film 170, reducing resistivity and so on. The heat treatment may be performed prior to forming the protecting layer 210.

(Holes 180 Provided in Translucent Electrode Film 170)

In the following description, functions of the holes 180 provided in the translucent electrode film 170 will be described.

Figure 3:
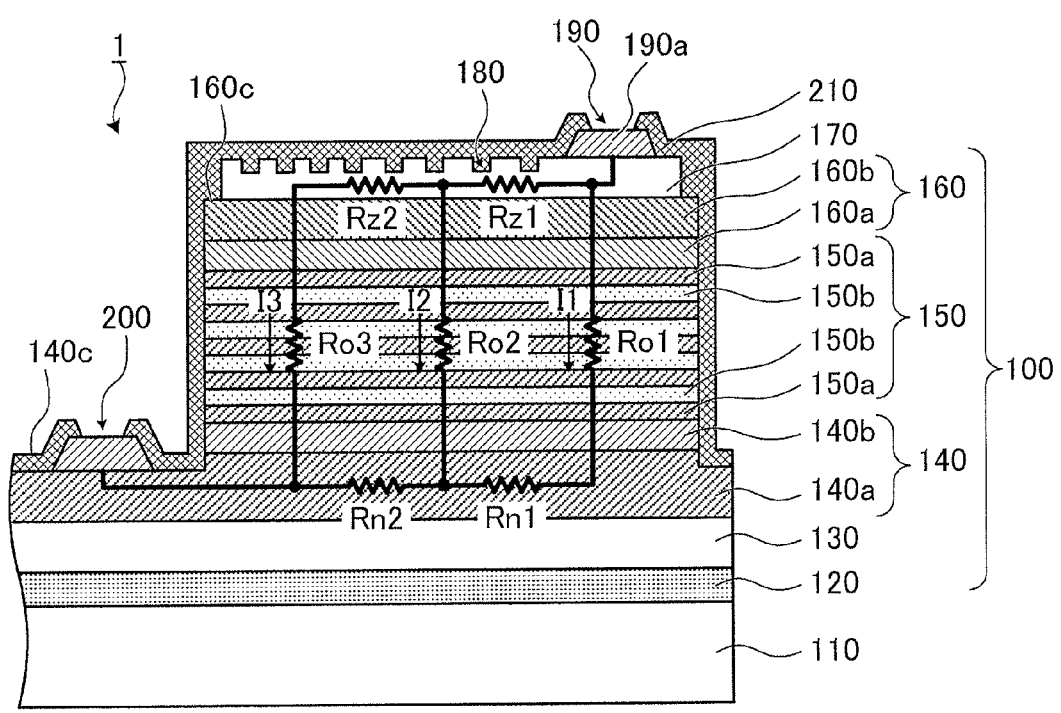
FIG. 3 is a diagram of a current path in the semiconductor light emitting element in a state of emitting light, the current path being represented by an equivalent circuit.

FIG. 3 is a diagram of a current path in the semiconductor light emitting element 1 in a state of emitting light, which is represented by an equivalent circuit. FIG. 3 extracts to show a right half of the semiconductor light emitting element 1 in FIG. 1, and indicates a current path from the p-electrode 190 to the n-electrode 200. In FIG. 3, the current path from the connecting portion 190a of the p-electrode 190 is indicated as an example; however, the same applies to a current path flowing from the extending portion 190b (refer to FIG. 2), which is connected to the connecting portion 190a, toward the n-electrode 200.

The resistance to the current diffusion in the translucent electrode film 170 (equivalent sheet resistance) is lower than the sheet resistance of the p-type semiconductor layer 160 (the p-contact layer 160b and the p-cladding layer 160a) even though the holes 180 are provided in the translucent electrode film 170. In addition, the sheet resistance of the n-contact layer 140a of the n-type semiconductor layer 140 is lower than the sheet resistance of the n-cladding layer 140b.

Accordingly, the current flowing from the p-electrode 190 toward the n-electrode 200 flows in the lateral direction within the surfaces of the translucent electrode film 170 to diffuse therein (current diffusion), and also flows into the light emitting layer 150 via the p-type semiconductor layer 160 (the p-contact layer 160b and the p-cladding layer 160a). Thereafter, via the n-cladding layer 140b of the n-type semiconductor layer 140, the current flows in the lateral direction within the surfaces of the n-contact layer 140a to diffuse therein (current diffusion), to thereby flow into the n-electrode 200.

In FIG. 3, resistances Rz1 and Rz2 in the translucent electrode film 170 are resistances to the current diffusion in the translucent electrode film 170. Similarly, resistances Rz1 and Rz2 in the n-contact layer 140a are resistances to the current diffusion in the n-contact layer 140a.

Resistances Ro1, Ro2 and Ro3 in the light emitting layer 150 are the resistances to the current flowing in the light emitting layer 150 in the on (light emitting)-state in the thickness direction.

The current I flowing from the p-electrode 190 toward the n-electrode 200 is a sum of a current I1 that flows in the resistance Ro1, a current I2 that flows in the resistance Ro2 and a current I3 that flows in the resistance Ro3, the resistances Ro1, Ro2 and Ro3 being in the light emitting layer 150.

The current I1 flows through the resistance Ro1 in the light emitting layer 150 and the resistances Rn1 and Rn2 in the n-contact layer 140a. The current I2 flows through the resistance Rz1 in the translucent electrode film 170, the resistance Ro2 in the light emitting layer 150 and the resistance Rn2 in the n-contact layer 140a. The current I3 flows through the resistances Rz1 and Rz2 in the translucent electrode film 170 and the resistance Ro3 in the light emitting layer 150.

In a case where the resistances Ro1, Ro2 and Ro3 in the light emitting layer 150 are assumed to be equal, the less the difference in the voltage to be applied to each resistance and the less the difference in the currents I1, I2 and I3 that flows through the resistances Ro1, Ro2 and Ro3, respectively, the more uniformly (evenly) the light emitting layer 150 emits light, which leads to a preferable result.

Figure 4A:
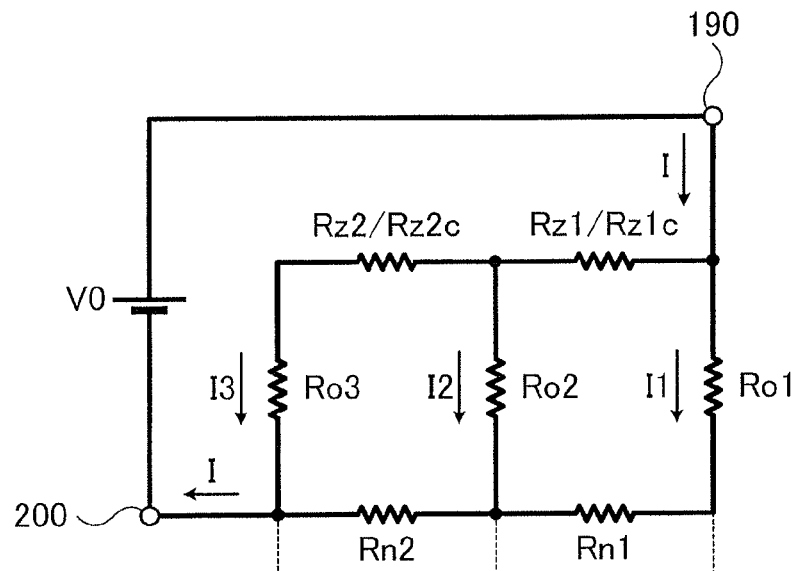
FIGS. 4A to 4C are diagrams illustrating the equivalent circuit of the current path in the semiconductor light emitting element shown in FIG. 3 and distributions of voltage applied to the light emitting layer.
Figure 4B:
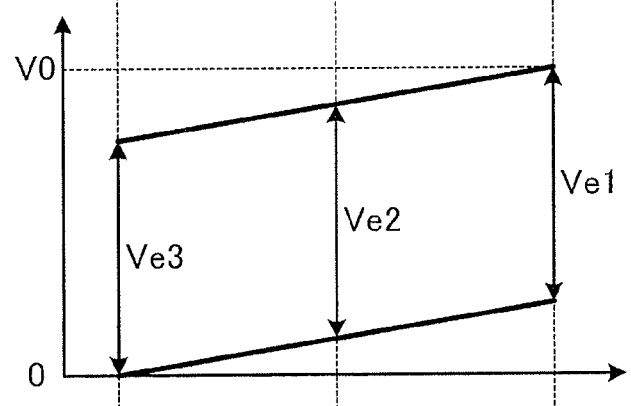
Figure 4C:
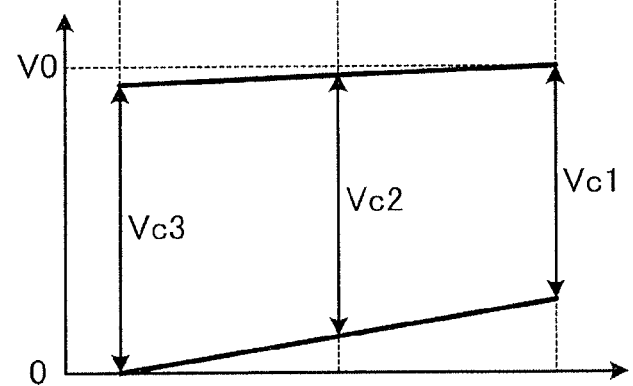

FIGS. 4A to 4C are diagrams illustrating the equivalent circuit of the current path in the semiconductor light emitting element 1 shown in FIG. 3 and distributions of voltage applied to the light emitting layer 150. FIG. 4A is an equivalent circuit of the current path in the semiconductor light emitting element 1 shown in FIG. 3, FIG. 4B indicates distribution of the voltage applied to the light emitting layer 150 in the case where the holes 180 are provided in the translucent electrode film 170 in the first exemplary embodiment, and FIG. 4C indicates distribution of the voltage applied to the light emitting layer 150 in the case where, different from the first exemplary embodiment, the holes 180 are not provided in the translucent electrode film 170. It should be noted that the resistances are indicated as Rz1 and Rz2 in the translucent electrode film 170 in the first exemplary embodiment as shown in FIG. 4A, whereas, in the case where, different from the first exemplary embodiment, the holes 180 are not provided in the translucent electrode film 170, the resistances are indicated as Rz1c and Rz2c.

Then, it is assumed that a voltage V0 is applied between the p-electrode 190 and the n-electrode 200. In other words, the voltage applied between the p-electrode 190 and the n-electrode 200 is the voltage V0.

Description will be given of the distribution of the voltage in the first exemplary embodiment shown in FIG. 4B.

As shown in FIG. 2, in the first exemplary embodiment, the density of the holes 180 provided in the translucent electrode film 170 is caused to be increased along with a move from the n-electrode 200 toward the p-electrode 190 (the connecting portion 190a and the extending portion 190b). Consequently, the resistances Rz1 and Rz2 shown in FIG. 4A become larger than the respective resistances in the case where the holes 180 are not provided. In addition, the resistance Rz2 is larger than the resistance Rz1.

Then, as shown in FIG. 4B, a difference between the voltage drop by the translucent electrode film 170 (the resistances Rz1 and Rz2) and the voltage drop by the n-contact layer 140a (the resistances Rn1 and Rn2) is reduced. This causes the differences between the voltages Ve1, Ve2 and Ve3 that are applied to the resistances Ro1, Ro2 and Ro3 in the light emitting layer 150, respectively, to be reduced. The differences between the currents I1, I2 and I3 that flow through the resistances Ro1, Ro2 and Ro3, respectively, are also reduced, to thereby make the light emitting layer 150 emit light uniformly (evenly).

Next, description will be given of the distribution of the voltage applied to the light emitting layer 150 in the case where, different from the first exemplary embodiment, the holes 180 are not provided in the translucent electrode film 170.

Since the holes 180 are not provided in the translucent electrode film 170, there is no difference between the resistances Rz1c and Rz2c in the translucent electrode film 170. The resistance Rz1c is lower than the resistance Rz1 in the case where the holes 180 are provided in the translucent electrode film 170, and similarly, the resistance Rz2c is lower than the resistance Rz2.

Accordingly, as shown in FIG. 4C, the voltage drop by the translucent electrode film 170 (the resistances Rz1c and Rz2c) becomes smaller than that in the case of the first exemplary embodiment shown in FIG. 4B.

In other words, in the case where the holes 180 are not provided in the translucent electrode film 170, there occur differences between the voltages Vc1, Vc2 and Vc3 that are applied to the resistances Ro1, Ro2 and Ro3 in the light emitting layer 150, respectively, as shown in FIG. 4C, the differences being larger than those in the case of the first exemplary embodiment as shown in FIG. 4B (Vc1<Vc2<Vc3). Accordingly, differences are caused between the currents I1, I2 and I3 that flow through the resistances Ro1, Ro2 and Ro3, respectively, the differences being larger than those in the case of the first exemplary embodiment as shown in FIG. 4B (I1<I2<I3). In other words, since light emission intensity differs depending upon the positions on the light emitting surface, light emission from the light emitting surface becomes non-uniform.

As described above, in the first exemplary embodiment, the resistances to the current diffusion in the translucent electrode film 170 is controlled to differ depending upon the position (region) on the surface thereof. This suppresses the difference in the voltage applied to the light emitting layer 150 to occur between the regions. Accordingly, light emission from the light emitting surface becomes more uniformly (evenly).

Then, in the first exemplary embodiment, control of the resistances to the current diffusion in the translucent electrode film 170 is performed by varying the density of the holes 180 provided in the translucent electrode film 170 in the positions (regions) on the surface thereof.

It should be noted that, in FIG. 2, description is given with an assumption that the planar shape of the semiconductor light emitting element 1 is a rectangular shape; however, the planar shape may be a square shape, other polygonal shapes, a circular shape, an elliptic shape or the like. The extending portion 190b is configured with combination of straight lines; however, the extending portion 190b may be configured with curved lines.

Figure 5:
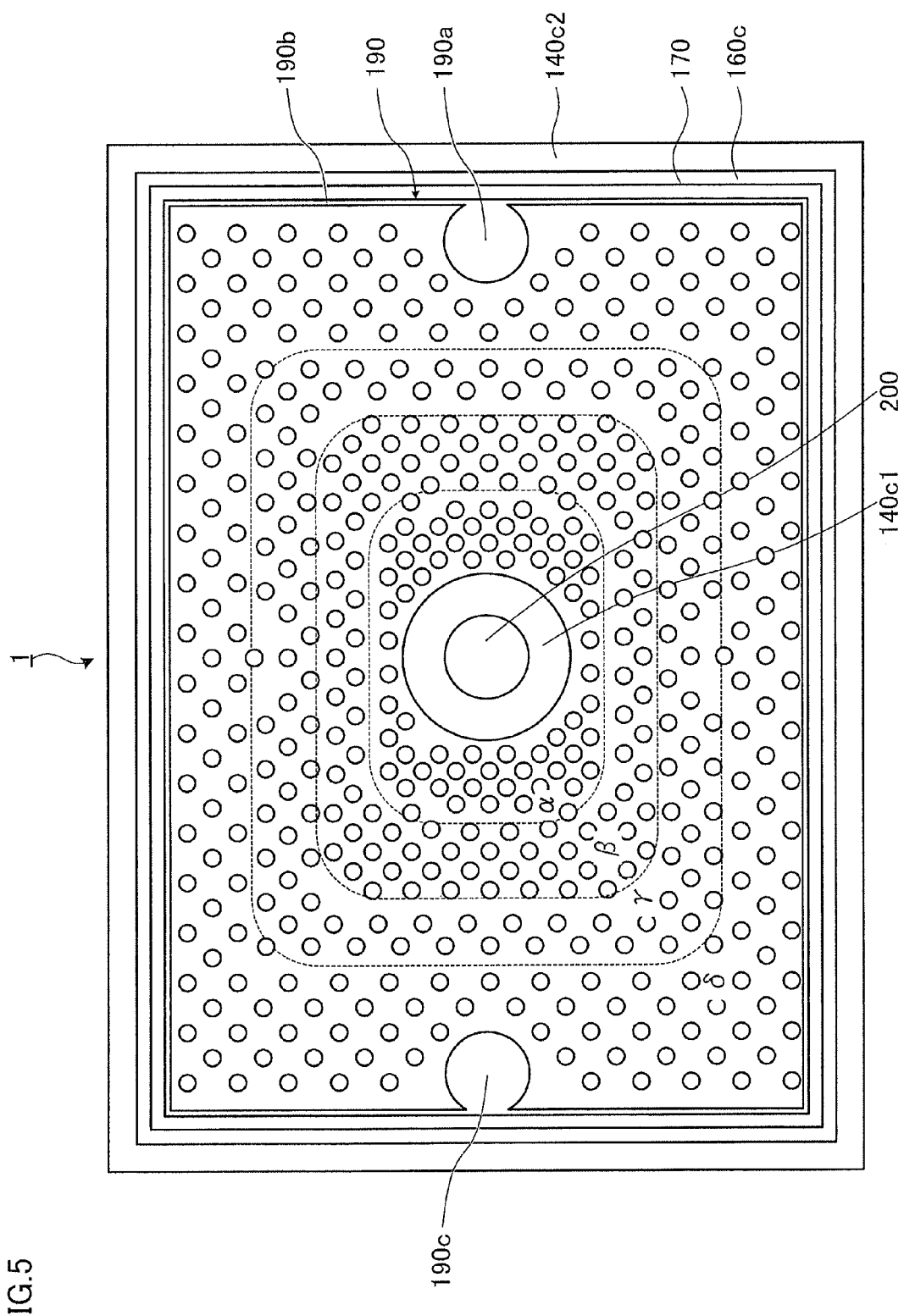
FIG. 5 is a diagram showing another example of the semiconductor light emitting element to which the first exemplary embodiment is applied.

FIG. 5 is a diagram showing another example of the semiconductor light emitting element 1 to which the first exemplary embodiment is applied. Similar to the semiconductor light emitting element 1 shown in FIG. 1, in this semiconductor light emitting element 1, the translucent electrode film 170 includes the holes 180 provided with the density varying depending upon the positions (the regions) on the surface thereof.

Similar to the semiconductor light emitting element 1 shown in FIG. 2, in this semiconductor light emitting element 1, the planar shape thereof is a rectangular shape, the semiconductor layer exposure surface 140c1 is provided at the center portion thereof, which has been formed by removing part of the laminated semiconductor layer 100, and the semiconductor layer exposure surface 140c2 is provided at the peripheral portion thereof, which has been formed in the same manner by removing part of the laminated semiconductor layer 100. Then, the translucent electrode film 170 is provided on the top surface 160c of the laminated semiconductor layer 100 so as to encircle the semiconductor layer exposure surface 140c1 at the center portion.

The semiconductor light emitting element 1 includes the connecting portion 190a of the p-electrode 190 on the translucent electrode film 170 on one end portion in the longitudinal direction (right side of the space in FIG. 5), and also includes a connecting portion 190c on the other end portion in the longitudinal direction (left side of the space in FIG. 5). The extending portion 190b connects the connecting portion 190a and the connecting portion 190c with each other, and is provided on the translucent electrode film 170 to make the circuit of the rim portion of the translucent electrode film 170.

Then, on the surface of the translucent electrode film 170, the holes 180, which do not reach the p-type semiconductor layer 160, are provided such that the density thereof on the n-electrode 200 side becomes higher than the density on the p-electrode 190 (the connecting portion 190a and the extending portion 190b) side. In other words, diameters of the holes 180 provided in the translucent electrode film 170 are the same; however, the density of the holes 180 is reduced along with a move from the region α near the n-electrode 200, which encircles the n-electrode 200, the region β which encircles the region α, the region γ which further encircles the region β, toward the region δ near the p-electrode 190, which encircles the region γ.

Then, the n-electrode 200 is provided on the semiconductor layer exposure surface 140c1 at the center portion of the semiconductor light emitting element 1.

Other configurations are the same as those in the semiconductor light emitting element 1 shown in FIG. 1, and accordingly, detailed description thereof will be omitted.

In this semiconductor light emitting element 1, a bonding wire is connected to each of the connecting portion 190a and the connecting portion 190c, and a voltage is applied to any one of them. Accordingly, since the voltage is applied to the extending portion 190b from any one of the connecting portion 190a and the connecting portion 190c, effect of the voltage drop by the resistance of the extending portion 190b can be further reduced.

As described so far, also in the semiconductor light emitting element 1 shown in FIG. 5, the resistances to the current diffusion in the translucent electrode film 170 are controlled to differ depending upon the position (the region) on the surface thereof. This suppresses the difference in the voltage applied to the light emitting layer 150 to occur between the regions. Accordingly, light emission from the light emitting surface becomes more uniformly (evenly).

It should be noted that, in FIG. 5, description is given with an assumption that the planar shape of the semiconductor light emitting element 1 is a rectangular shape; however, the planar shape may be a square shape, other polygonal shapes, a circular shape, an elliptic shape or the like. The extending portion 190b is configured with combination of straight lines; however, the extending portion 190b may be configured with curved lines.

Moreover, in the region δ that is adjacent to the p-electrode 190 (the connecting portion 190a, the extending portion 190b and the connecting portion 190c), the holes 180 may not be provided.

Figure 6:
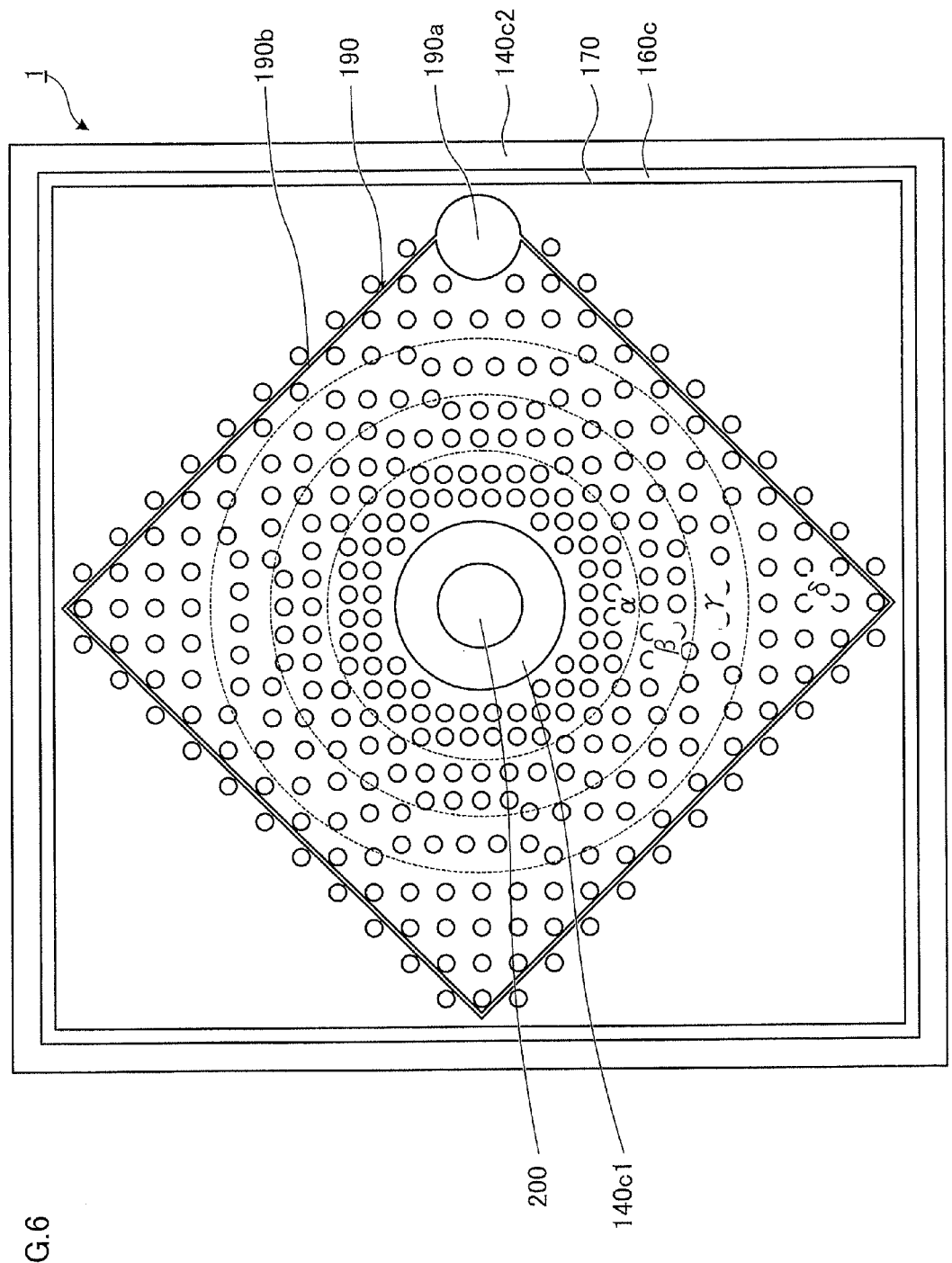
FIG. 6 is a diagram showing still another example of the semiconductor light emitting element to which the first exemplary embodiment is applied.

FIG. 6 is a diagram showing still another example of the semiconductor light emitting element 1 to which the first exemplary embodiment is applied. Similar to the semiconductor light emitting element 1 shown in FIG. 1, in this semiconductor light emitting element 1, the translucent electrode film 170 includes the holes 180 provided with the density varying depending upon the positions (the regions) on the surface thereof.

In this semiconductor light emitting element 1, the planar shape thereof is a square shape, the semiconductor layer exposure surface 140c1 is provided at the center portion thereof, which has been formed by removing part of the laminated semiconductor layer 100, and the semiconductor layer exposure surface 140c2 is provided at the peripheral portion thereof, which has been formed in the same manner by removing part of the laminated semiconductor layer 100. Then, the translucent electrode film 170 is provided on the top surface 160c of the laminated semiconductor layer 100 so as to encircle the semiconductor layer exposure surface 140c1 at the center portion.

The semiconductor light emitting element 1 includes the connecting portion 190a of the p-electrode 190 on a position on the translucent electrode film 170, which is in the proximity of a center of one side of the square. The extending portion 190b is provided on the translucent electrode film 170 to extend in two directions (in FIG. 6, the directions being inclined 45°) from the connecting portion 190a, each of which intersects one side of the square. The extending portion 190b that extends in two directions is bent in the proximity of another side of the square (the region close to an end portion on the translucent electrode film 170). In other words, the extending portion 190b is configured such that the outer shape thereof is a square shape, and is rotated 45° from the square of the planar shape of the semiconductor light emitting element 1 to be included within the square of the planar shape of the semiconductor light emitting element 1. Further, the extending portion 190b is closed to encircle the semiconductor layer exposure surface 140c1.

It should be noted that the extending portion 190b is assumed to be closed to encircle the semiconductor layer exposure surface 140c1 at the center portion on the semiconductor light emitting element 1; however, the extending portion 190b may not be closed. Similar to the semiconductor light emitting element 1 shown in FIG. 1, the extending portion 190b may be interrupted at a portion farthest from (a portion facing) the connecting portion 190a.

As described above, the extending portion 190b applies the voltage, which has been applied to the connecting portion 190a, to the translucent electrode film 170 with a voltage drop smaller than that in the case where the extending portion 190b is not provided. In other words, the extending portion 190b is only required to apply the voltage, which has been applied to the connecting portion 190a, to the translucent electrode film 170 with a small voltage drop.

Then, on the surface of the translucent electrode film 170, the holes 180, which do not reach the p-type semiconductor layer 160, are provided such that the density thereof on the n-electrode 200 side becomes higher than the density thereof on the p-electrode 190 (the connecting portion 190a and the extending portion 190b) side. In other words, diameters of the holes 180 provided in the translucent electrode film 170 are the same; however, the density of the holes 180 is reduced along with a move from the region α near the n-electrode 200, which encircles the n-electrode 200, the region β which encircles the region α, the region γ which further encircles the region β, toward the region δ near the p-electrode 190, which encircles the region γ.

Then, the n-electrode 200 is provided on the semiconductor layer exposure surface 140c1 at the center portion of the semiconductor light emitting element 1.

Other configurations are the same as those in the semiconductor light emitting element 1 shown in FIG. 1, and accordingly, detailed description thereof will be omitted.

In this semiconductor light emitting element 1, non-uniformity in light emission intensity is suppressed in a range encircled by the extending portion 190b.

It should be noted that description is given with an assumption that the planar shape of the semiconductor light emitting element 1 is a square shape; however, the planar shape may be a rectangular shape, and the extending portion 190b is not necessarily provided to intersect the side of the semiconductor light emitting element 1 at 45°, and may be provided to intersect at an angle other than 45°. In addition, the extending portion 190b is configured with combination of straight lines; however, the extending portion 190b may be configured with curved lines.

Moreover, in FIG. 6, the holes 180 in the translucent electrode film 170 in the semiconductor light emitting element 1 are provided in a region encircled by the extending portion 190b, and are also provided beyond and outside the extending portion 190b. However, the holes 180 may be formed only in the region encircled by the extending portion 190b. Moreover, the holes 180 may not be provided in the region δ that is adjacent to the p-electrode 190 (the connecting portion 190a and the extending portion 190b).

[Second Exemplary Embodiment]

In the first exemplary embodiment, the resistances to the current diffusion in the translucent electrode film 170 are controlled by the density of the holes 180. In contrast, in the second exemplary embodiment, the resistances to the current diffusion in the translucent electrode film 170 are controlled by the size (diameter) of the holes 180.

Figure 7:
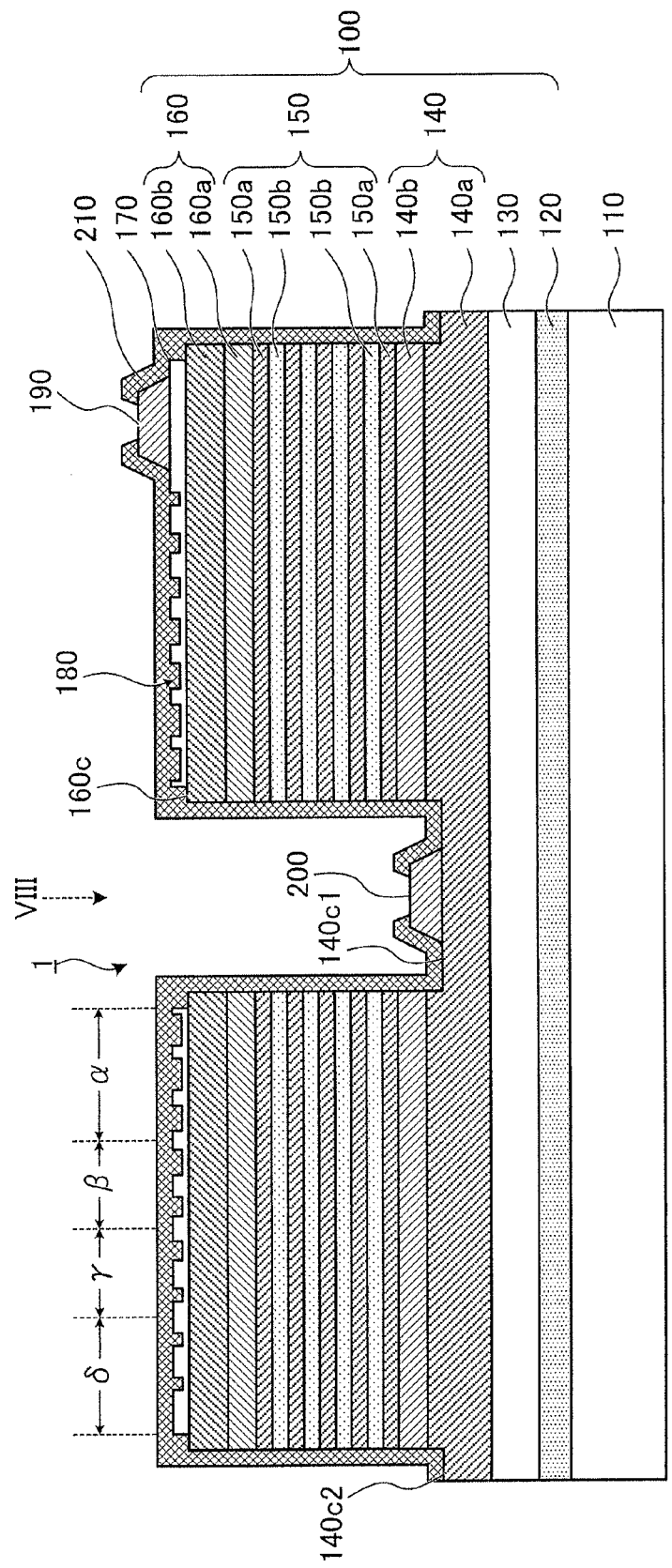
FIG. 7 is a diagram illustrating an example of a cross-sectional schematic view of a semiconductor light emitting element to which a second exemplary embodiment is applied.
Figure 8:
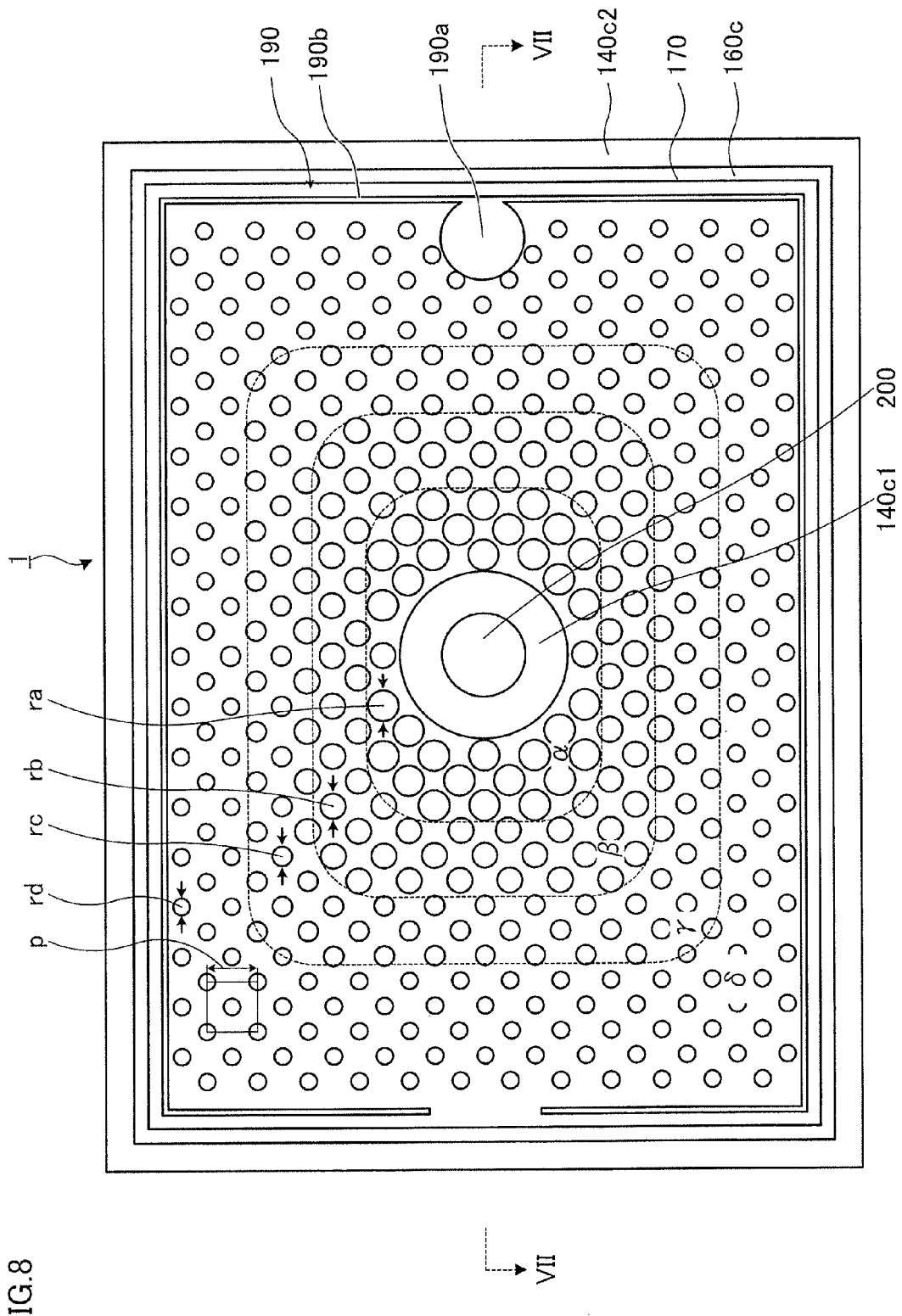
FIG. 8 is a diagram illustrating an example of a planar schematic view of the semiconductor light emitting element shown in FIG. 7.

FIG. 7 is a diagram illustrating an example of a cross-sectional schematic view of a semiconductor light emitting element 1 to which the second exemplary embodiment is applied, and FIG. 8 is a diagram illustrating an example of a planar schematic view of the semiconductor light emitting element 1 shown in FIG. 7. It should be noted that the cross-sectional schematic view of the semiconductor light emitting element 1 shown in FIG. 7 is a cross-sectional view cut along the VII-VII line in FIG. 8. Moreover, the planar schematic view of the semiconductor light emitting element 1 shown in FIG. 8 is a planar schematic view as viewed from the direction of arrow VIII in FIG. 7.

Hereinafter, components different from those of the semiconductor light emitting element 1 in the first exemplary embodiment will be described, and description for the same components will be omitted.

(Semiconductor Light Emitting Element 1)

As shown in FIGS. 7 and 8, in the semiconductor light emitting element 1 in the second exemplary embodiment, configuration of the holes 180 provided in the translucent electrode film 170 is different from the semiconductor light emitting element 1 in the first exemplary embodiment shown in FIGS. 1 and 2.

In the first exemplary embodiment, the diameters of the holes 180 are equal, and the density is varied depending upon the position on the surface (the regions α, β, γ and δ). In contrast, in the second exemplary embodiment, the density of the holes 180 is the same, whereas the diameter (diameters ra, rb, rc and rd) is varied depending upon the position on the surface (the regions α, β, γ and δ).

Similar to the first exemplary embodiment, in the translucent electrode film 170 of the semiconductor light emitting element 1, there are provided the region α adjacent to the n-electrode 200 and encircling the n-electrode 200, the region β encircling the region α, the region γ encircling the region β and the region δ encircling the region γ and including the p-electrode 190 (the connecting portion 190a and the extending portion 190b) formed therein.

As shown in FIG. 8, the centers of the holes 180 provided in each of the regions α, β, γ and δ coincide with vertices and a center of a square in which a length of one side is p. The hole 180 in the region α has a diameter ra, the hole 180 in the region β has a diameter rb, which is shorter than the diameter ra, the hole 180 in the region γ has a diameter rc, which is shorter than the diameter rb, and the hole 180 in the region δ has a diameter rd, which is shorter than the diameter rc (ra>rb>rc>rd).

In this manner, even though the density of the holes 180 is set at the same and the diameters thereof (the diameters ra, rb, rc and rd) are varied, the resistances (equivalent sheet resistances) to the current diffusion in a range including the holes 180 in the translucent electrode film 170 are caused to be varied depending upon the regions (the regions α, β, γ and δ).

In other words, since the diameter ra is larger than the diameter rb (ra>rb), the flow of the current in the surface direction of the translucent electrode film 170 is more hindered in the region α, compared to the region 3, and thereby the resistances to the current diffusion in the translucent electrode film 170 become large.

The same is true in the other regions γ and δ. In other words, the resistance to the current diffusion in the translucent electrode film 170 is the largest in the region α, and becomes smaller in the order of the regions β, γ and δ.

Accordingly, similar to the first exemplary embodiment described above, the resistances to the current diffusion in the translucent electrode film 170 are controlled to differ depending upon the positions (the regions) on the surface thereof. This reduces the difference in the voltage applied to the light emitting layer 150 between the regions, to thereby cause the light emitting surface to emit light more uniformly (evenly).

It should be noted that the semiconductor light emitting element 1 of the second exemplary embodiment can be manufactured in the same way as the semiconductor light emitting element 1 of the first exemplary embodiment. Accordingly, description of the method for manufacturing the semiconductor light emitting element 1 of the second exemplary embodiment will be omitted.

In FIG. 8, description is given with an assumption that the planar shape of the semiconductor light emitting element 1 is a rectangular shape; however, the planar shape may be a square shape, other polygonal shapes, a circular shape, an elliptic shape or the like. The extending portion 190b is configured with combination of straight lines; however, the extending portion 190b may be configured with curved lines.

Further, the planar shape of the hole 180 is not necessarily the circular shape, but may be an elliptic shape or a polygonal shape.

Moreover, the translucent electrode film 170 is divided into four regions here; however, there may be at least two regions. Moreover, the translucent electrode film 170 is not necessarily divided into the regions, and the diameters of the holes 180 may be continuously reduced along with a move from the n-electrode 200 toward the p-electrode 190. Further, in the region where the diameters of the holes 180 are small (the region δ in FIG. 8), the holes 180 are not necessarily provided.

Boundaries between the regions are not necessarily marked explicitly.

Further, the centers of the holes 180 are assumed to be positioned at the vertices and the center of a square; however, the centers of the holes 180 may be provided at vertices of other polygons, or may be arranged randomly.

Still further, the second exemplary embodiment may be applied to the semiconductor light emitting element 1 shown in FIG. 5 or FIG. 6.

[Third Exemplary Embodiment]

The resistances to the current diffusion in the translucent electrode film 170 are controlled by the density of the holes 180 in the first exemplary embodiment, and by the size of the holes 180 in the second exemplary embodiment. In the third exemplary embodiment, the resistances to the current diffusion in the translucent electrode film 170 will be controlled by the thickness of the translucent electrode film 170.

Figure 9:
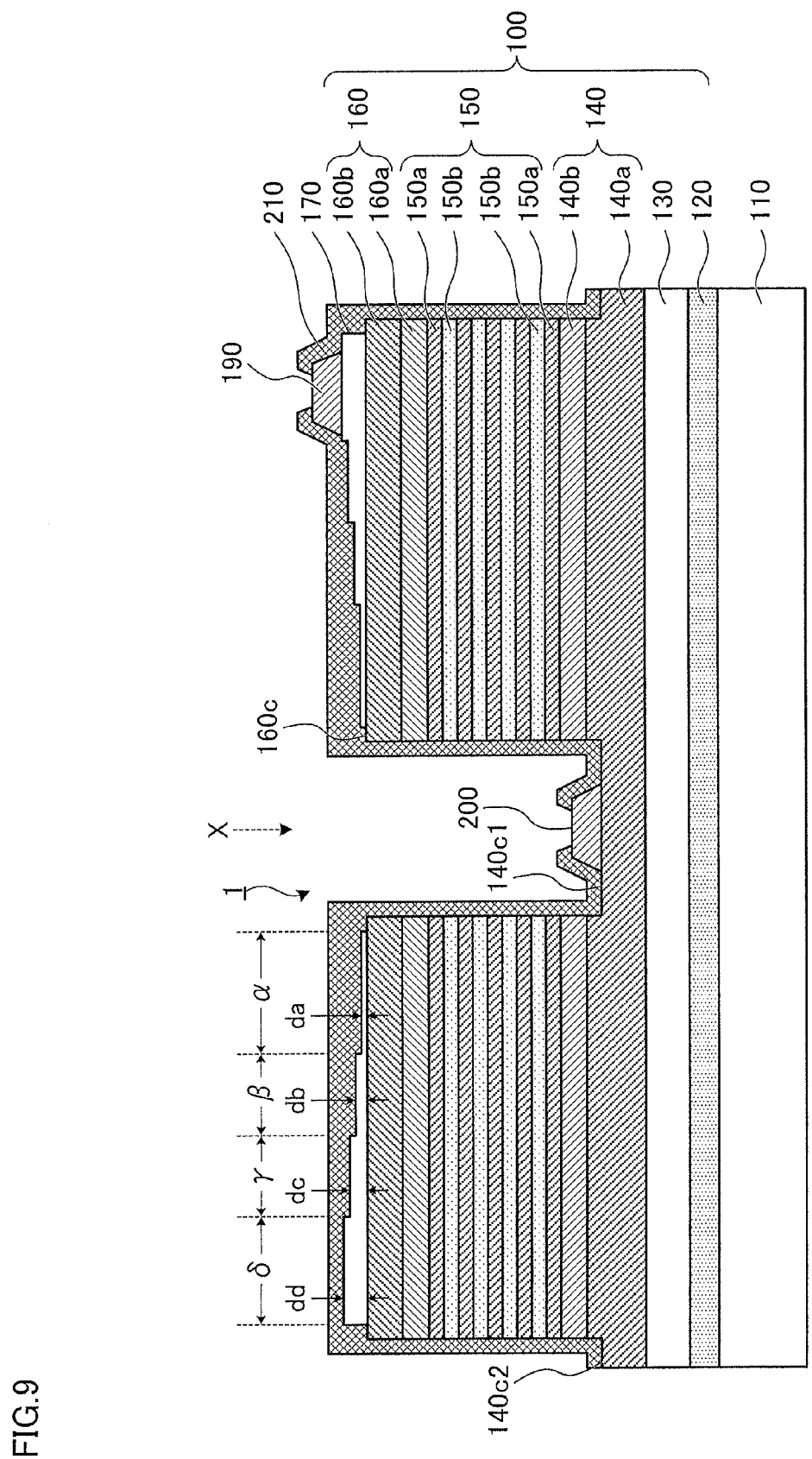
FIG. 9 is a diagram illustrating an example of a cross-sectional schematic view of a semiconductor light emitting element to which a third exemplary embodiment is applied.
Figure 10:
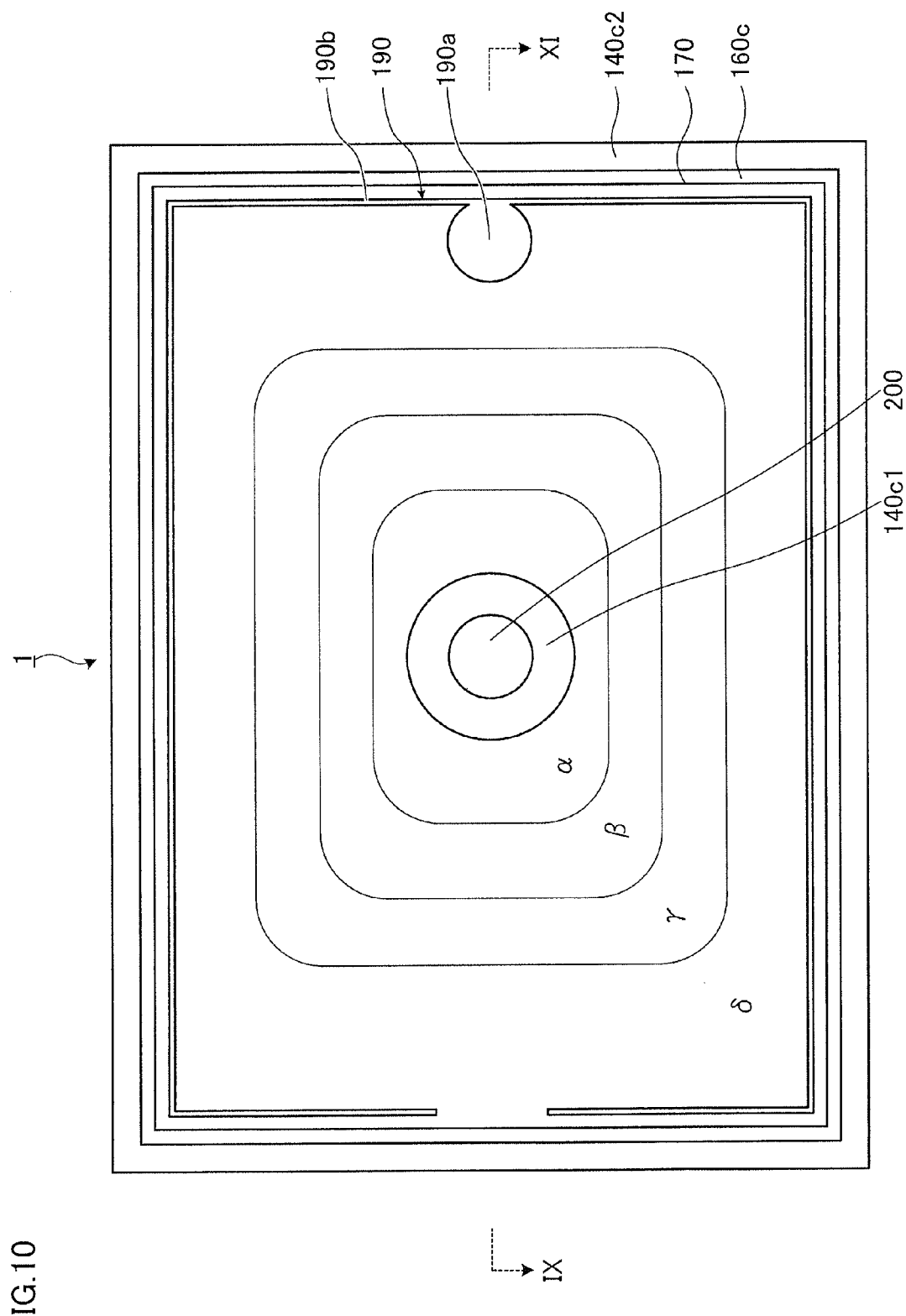
FIG. 10 is a diagram illustrating an example of a planar schematic view of the semiconductor light emitting element shown in FIG. 9.

FIG. 9 is a diagram illustrating an example of a cross-sectional schematic view of the semiconductor light emitting element 1 to which the third exemplary embodiment is applied, and FIG. 10 is a diagram illustrating an example of a planar schematic view of the semiconductor light emitting element 1 shown in FIG. 9. It should be noted that the cross-sectional schematic view of the semiconductor light emitting element 1 shown in FIG. 9 is a cross-sectional view cut along the IX-IX line in FIG. 10. Moreover, the planar schematic view of the semiconductor light emitting element 1 shown in FIG. 10 is a planar schematic view as viewed from the direction of arrow X in FIG. 9.

Hereinafter, components different from those of the semiconductor light emitting element 1 in the first exemplary embodiment and the second exemplary embodiment will be described, and description for the same components will be omitted.

(Semiconductor Light Emitting Element 1)

As shown in FIGS. 9 and 10, in the semiconductor light emitting element 1 in the third exemplary embodiment, configuration of the translucent electrode film 170 is different from the semiconductor light emitting element 1 in the first exemplary embodiment shown in FIGS. 1 and 2, and the semiconductor light emitting element 1 in the second exemplary embodiment shown in FIGS. 7 and 8.

In the first exemplary embodiment, the diameters of the holes 180 are equal, and the density is varied depending upon the position on the surface (the regions α, β, γ and δ). In the second exemplary embodiment, the density of the holes 180 is the same, whereas the diameter (diameters ra, rb, rc and rd) is varied depending upon the position on the surface (the regions α, β, γ and δ). In contrast, in the third exemplary embodiment, the thickness of the translucent electrode film 170 (the thicknesses da, db, dc and dd) is varied depending upon the position on the surface (the regions α, β, γ and δ).

Similar to the first exemplary embodiment and the second exemplary embodiment, in the translucent electrode film 170 of the semiconductor light emitting element 1, there are provided the region α adjacent to the n-electrode 200 and encircling the n-electrode 200, the region β encircling the region α, the region γ encircling the region β and the region δ encircling the region γ and including the p-electrode 190 (the connecting portion 190a and the extending portion 190b) formed therein.

As shown in FIG. 9, the translucent electrode film 170 has: a thickness da in the region α; a thickness db in the region β, which is thicker than da; a thickness dc in the region γ, which is thicker than db; and a thickness dd in the region δ, which is thicker than dc (da<db<dc<dd).

In this manner, even though the thickness of the translucent electrode film 170 (the thicknesses da, db, dc and dd) is varied, it is possible to cause the resistances to the current diffusion to be varied depending upon the regions (the regions α, β, γ and δ).

In other words, since the thickness da in the region α is thinner than the thickness db in the region β, the resistance to the current diffusion in the translucent electrode film 170 in the region α becomes larger than the resistance in the region β.

The same is true in the other regions γ and δ. In other words, the resistance to the current diffusion in the translucent electrode film 170 is the largest in the region α, and becomes smaller in the order of the regions β, γ and δ.

Accordingly, similar to the first exemplary embodiment and the second exemplary embodiment described above, the resistances to the current diffusion in the translucent electrode film 170 are controlled to differ depending upon the positions (the regions) on the surface thereof. This reduces the difference in the voltage applied to the light emitting layer 150 between the regions, to thereby cause the light emitting surface to emit light more uniformly (evenly).

To form the translucent electrode film 170 in the semiconductor light emitting element 1 of the third exemplary embodiment, a film of a material constituting the translucent electrode film 170 is formed to have the thickness dd, and processed into the outer shape of the translucent electrode film 170 by a known photolithographic technique, and thereafter, by using the known photolithographic technique further, the film is processed such that the regions α, β and γ have the thickness dc. Next, by using the known photolithographic technique further, the film is processed such that the regions α and β have the thickness db. Then, by using the known photolithographic technique still further, the film is processed such that the region α has the thickness da.

In other words, by reducing in order the thickness of the film of a material constituting the translucent electrode film 170 initially having the thickness dd so that each of the regions has the predetermined thickness, it is possible to provide different thicknesses (the thicknesses da, db, dc and dd) to the respective regions (the regions α, β, γ and δ).

It should be noted that the translucent electrode film 170 may also be processed as follows. A film of a material constituting the translucent electrode film 170 is formed to have the thickness dd, and processed into the outer shape of the translucent electrode film 170 by a known photolithographic technique, and thereafter, by using the known photolithographic technique further, the film is processed such that the region γ have the thickness dc. Next, by using the known photolithographic technique further, the film is processed such that the region β has the thickness db. Then, by using the known photolithographic technique still further, the film is processed such that the region α has the thickness da.

In other words, by processing the film of a material constituting the translucent electrode film 170 initially having the thickness dd so that each of the regions has the predetermined thickness, it is possible to provide different thicknesses (the thicknesses da, db, dc and dd) to the respective regions (the regions α, β, γ and δ).

It should be noted that, in FIG. 10, the planar shape of the semiconductor light emitting element 1 is represented as a rectangular shape; however, the planar shape may be a square shape, other polygonal shapes, a circular shape, an elliptic shape or the like. The extending portion 190b is configured with combination of straight lines; however, the extending portion 190b may be configured with curved lines.

It should be noted that, the translucent electrode film 170 is divided into four regions here; however, there may be at least two regions.

The third exemplary embodiment may be applied to the semiconductor light emitting element 1 shown in FIG. 5 or FIG. 6.

[Fourth Exemplary Embodiment]

From the first to third exemplary embodiments, the p-electrode 190 is provided at the peripheral portion in the planar shape of the semiconductor light emitting element 1, and the n-electrode 200 is provided at the center portion. In the fourth exemplary embodiment, the p-electrode 190 is provided at the center portion in the planar shape of the semiconductor light emitting element 1, and the n-electrode 200 is provided at the peripheral portion.

Figure 11:
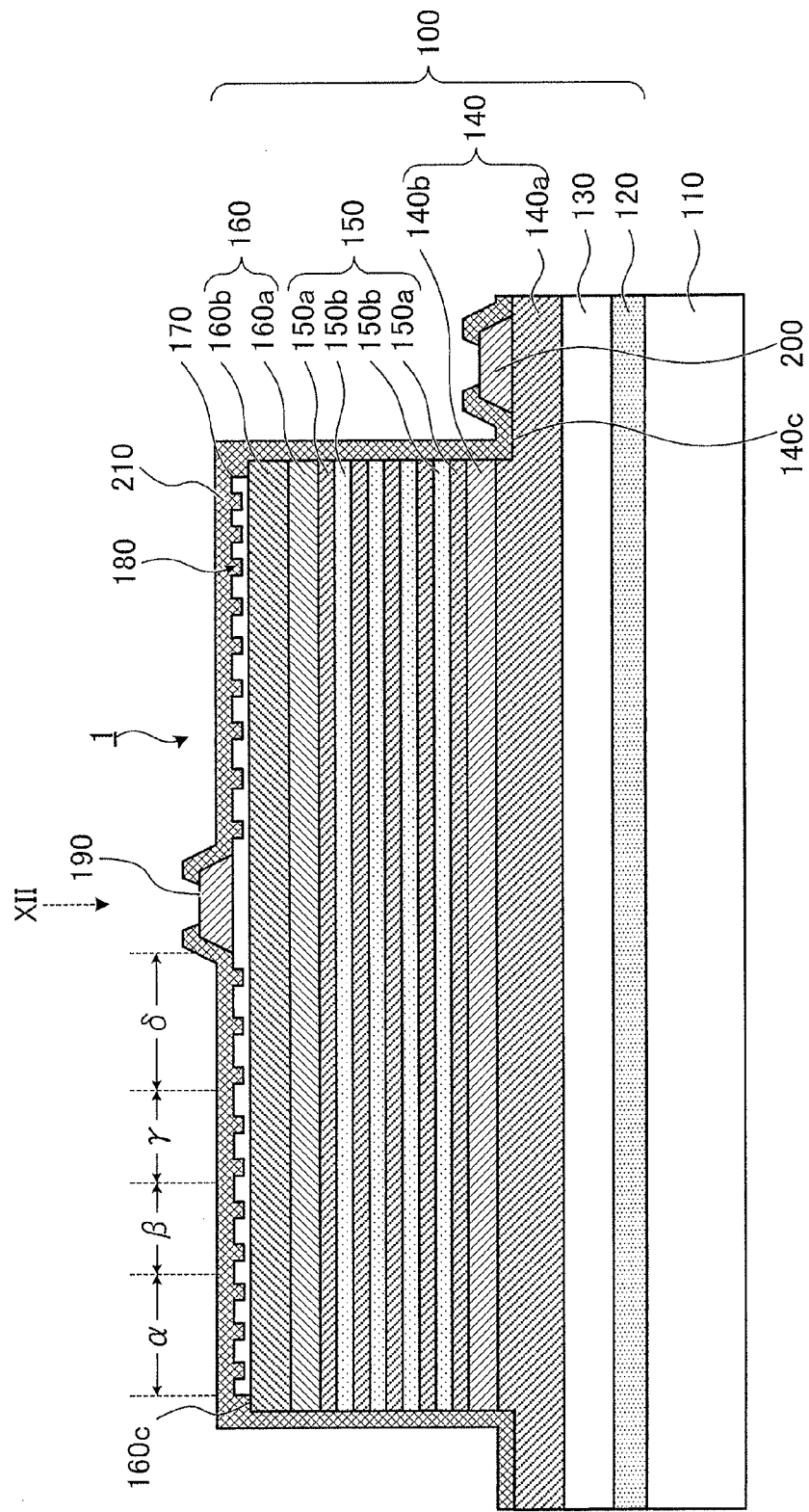
FIG. 11 is a diagram illustrating an example of a cross-sectional schematic view of a semiconductor light emitting element to which a fourth exemplary embodiment is applied.
Figure 12:
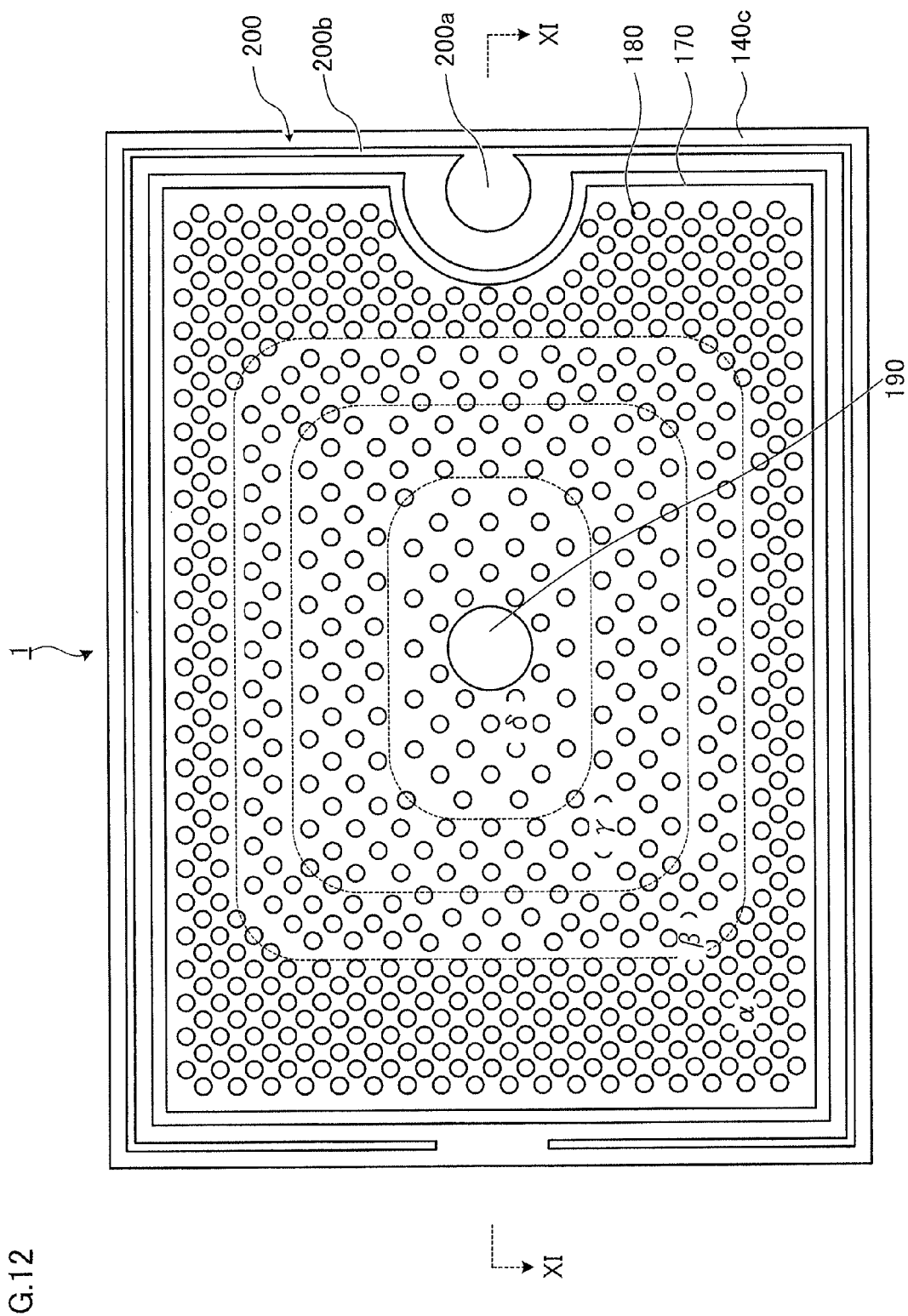
FIG. 12 is a diagram illustrating an example of a planar schematic view of the semiconductor light emitting element shown in FIG. 11.

FIG. 11 is a diagram illustrating an example of a cross-sectional schematic view of the semiconductor light emitting element 1 to which the fourth exemplary embodiment is applied, and FIG. 12 is a diagram illustrating an example of a planar schematic view of the semiconductor light emitting element 1 shown in FIG. 11. It should be noted that the cross-sectional schematic view of the semiconductor light emitting element 1 shown in FIG. 11 is a cross-sectional view cut along the XI-XI line in FIG. 12. Moreover, the planar schematic view of the semiconductor light emitting element 1 shown in FIG. 12 is a planar schematic view as viewed from the direction of arrow XII in FIG. 11.

Hereinafter, components different from those of the semiconductor light emitting element 1 in the first exemplary embodiment will be described, and description for the same components will be omitted.

(Semiconductor Light Emitting Element 1)

As shown in FIGS. 11 and 12, in the semiconductor light emitting element 1 in the fourth exemplary embodiment, positions where the p-electrode 190 and the n-electrode 200 are provided are different from the semiconductor light emitting element 1 in the first exemplary embodiment shown in FIGS. 1 and 2.

Similar to the semiconductor light emitting element 1 shown in FIG. 1, this semiconductor light emitting element 1 has a rectangular planar shape. On the peripheral portion thereof, the semiconductor layer exposure surface 140c is provided. It should be noted that the semiconductor layer exposure surface 140c is provided to expand from a center portion of one of short sides of the rectangle (the right side of the space in FIG. 12), and on the semiconductor layer exposure surface 140c, a connecting portion 200a of the n-electrode 200 is provided.

Then, on the semiconductor layer exposure surface 140c on the peripheral portion of the semiconductor light emitting element 1, an extending portion 200b is provided to round the semiconductor light emitting element 1 from the connecting portion 200a. It should be noted that both end portions of the extending portion 200b are not connected to each other at a position facing the connecting portion 200a (the left side of the space in FIG. 12).

Then, on the top surface 160c of the laminated semiconductor layer 100 surrounded by the semiconductor layer exposure surface 140c, the translucent electrode film 170 is provided. At the center portion of the translucent electrode film 170, the p-electrode 190 is provided. Here, description will be given with an assumption that each of the p-electrode 190 and the connecting portion 200a of the n-electrode 200 has a circular shape.

On the surface of the translucent electrode film 170, the holes 180, which have the same diameters and do not reach the p-type semiconductor layer 160, are provided. Similar to the first exemplary embodiment, the centers of the holes 180 are provided at the vertices and the center of a square. The density of the holes 180 is higher at the n-electrode 200 (the connecting portion 200a and the extending portion 200b) side than that at the p-electrode 190 side. In other words, the density of the holes 180 provided in the translucent electrode film 170 becomes higher along with a move from a region δ adjacent to the p-electrode 190 and encircling the p-electrode 190, a region γ encircling the region δ, a region β further encircling the region γ, toward a region α encircling the region β and adjacent to the n-electrode 200 (the connecting portion 200a and the extending portion 200b). It should be noted that, since the regions α, β, γ and δ are arranged in descending order of the density of the holes 180, the regions are arranged in reverse of the arrangement of the regions α, β, γ and δ in FIGS. 1, 2, 5 and 6 in the first exemplary embodiment, FIGS. 7 and 8 in the second exemplary embodiment and FIGS. 9 and 10 in the third exemplary embodiment.

With this configuration, it is possible to set the resistances to the current diffusion in the translucent electrode film 170 to increase in order from the p-electrode 190 side toward the n-electrode 200 (the connecting portion 200a and the extending portion 200b) side.

As described so far, also in the fourth exemplary embodiment, the resistances to the current diffusion in the translucent electrode film 170 are controlled to differ depending upon the positions (the regions) on the surface thereof. This reduces the difference in the voltage applied to the light emitting layer 150 between the regions, to thereby cause the light emitting surface to emit light more uniformly (evenly).

It should be noted that the semiconductor light emitting element 1 of the fourth exemplary embodiment can be manufactured in the same way as the semiconductor light emitting element 1 of the first exemplary embodiment. Accordingly, description of the method for manufacturing the semiconductor light emitting element 1 of the fourth exemplary embodiment will be omitted.

In FIG. 12, description is given with an assumption that the planar shape of the semiconductor light emitting element 1 is a rectangular shape; however, the planar shape may be a square shape, other polygonal shapes, a circular shape, an elliptic shape or the like. The extending portion 200b is configured with combination of straight lines; however, the extending portion 200b may be configured with curved lines.

Further, the planar shape of the hole 180 is not necessarily the circular shape, but may be an elliptic shape or a polygonal shape.

It should be noted that the translucent electrode film 170 is divided into four regions here; however, there may be at least two regions. Moreover, the translucent electrode film 170 is not necessarily divided into the regions, and the density of the holes 180 may be continuously varied to be decreased along with a move from the n-electrode 200 toward the p-electrode 190. Further, in the region where the density of the holes 180 is low (the region δ in FIG. 12), the holes 180 are not necessarily provided.

Boundaries between the regions are not necessarily marked explicitly.

Further, the centers of the holes 180 are assumed to be positioned at the vertices and the center of a square; however, the centers of the holes 180 may be provided at vertices of other polygons, or may be arranged randomly.

The semiconductor light emitting element 1 shown in FIGS. 5 and 6, the second exemplary embodiment or the third exemplary embodiment can be applied to the semiconductor light emitting element 1 shown in the fourth exemplary embodiment.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light emitting element comprising:
   a first semiconductor layer composed of a group III-V semiconductor having a first conduction type;
   a light emitting layer composed of a group III-V semiconductor, which is provided on and in contact with the first semiconductor layer, the light emitting layer emitting light by passing a current;
   a second semiconductor layer composed of a group III-V semiconductor having a second conduction type that is opposite to the first conduction type, the second semiconductor layer being provided on and in contact with the light emitting layer;
   a translucent electrode film provided on and in contact with the second semiconductor layer, the translucent electrode film having permeability to the light emitted from the light emitting layer;
   a first electrode provided on and in contact with part of the translucent electrode film, the first electrode serving as one of terminals for passing a current through the light emitting layer; and a second electrode connected to the first semiconductor layer and provided on the same surface side with the first electrode, the second electrode serving as the other one of the terminals for passing a current through the light emitting layer, wherein one of the first electrode and the second electrode is positioned at a center portion in a planar shape of the light emitting layer, the other one of the first electrode and the second electrode includes a connecting portion to which a voltage is applied from outside and an extending portion that extends from the connecting portion to face at least part of a periphery of the one of the first electrode and the second electrode, the extending portion being set at the voltage, the translucent electrode film is divided into a plurality of regions that continue from the first electrode toward the second electrode, and a resistance in an in-plane direction in each of the plurality of regions is set to be increased in order from a region that is adjacent to the first electrode toward a region that is adjacent to the second electrode, and wherein the resistance in the in-plane direction in each of the plurality of regions of the translucent electrode film is set by providing a plurality of holes in the translucent electrode film such that at least one of a size and a density of the plurality of holes is varied.

2. The semiconductor light emitting element according to claim 1, wherein the first conduction type is an n-type and the second conduction type is a p-type.

3. The semiconductor light emitting element according to claim 1, wherein the translucent electrode film is composed of a conductive oxide material.

4. The semiconductor light emitting element according to claim 2, wherein the translucent electrode film is composed of a conductive oxide material.

* * * * *